(12) United States Patent
Takatsuka et al.

(10) Patent No.: US 6,813,211 B2
(45) Date of Patent: Nov. 2, 2004

(54) FULLY HIDDEN REFRESH DYNAMIC RANDOM ACCESS MEMORY

(75) Inventors: Takafumi Takatsuka, Hyogo (JP); Hirotoshi Sato, Hyogo (JP); Masaki Tsukude, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/342,289

(22) Filed: Jan. 15, 2003

(65) Prior Publication Data

US 2003/0198090 A1 Oct. 23, 2003

(30) Foreign Application Priority Data

Apr. 17, 2002 (JP) ........................................ 2002-114504

(51) Int. Cl.[7] .............................................. G11C 7/00
(52) U.S. Cl. ....................................... 365/222; 365/194
(58) Field of Search ................................. 365/222, 194, 365/196, 189.01, 189.05

(56) References Cited

U.S. PATENT DOCUMENTS

| | | | | |
|---|---|---|---|---|
| 6,388,934 B1 | * | 5/2002 | Tobita ......................... | 365/222 |
| 6,449,204 B1 | * | 9/2002 | Arimoto et al. ............ | 365/222 |
| 6,463,002 B2 | * | 10/2002 | Kim et al. .................... | 365/222 |
| 6,507,529 B2 | * | 1/2003 | Fujimoto et al. ............ | 365/222 |
| 6,590,823 B2 | * | 7/2003 | Tsukude ...................... | 365/222 |
| 6,697,910 B2 | * | 2/2004 | Tsukude et al. ............. | 711/106 |

FOREIGN PATENT DOCUMENTS

| | | |
|---|---|---|
| JP | 03-105790 | 5/1991 |
| JP | 05-282865 | 10/1993 |
| JP | 11-339468 | 12/1999 |

OTHER PUBLICATIONS

"A 30–$\mu$A Data–Retention Pseudostatic RAM with Virtually Static RAM Mode", K. Sawada et al., IEEE Journal of Solid–State Circuits, vol. 23, No. 1, Feb. 1988, pp. 12–19.
Related U.S. patent application Ser. No. 09/987,895, filed Nov. 16, 2001—(Our Reference No. 57454–291).

* cited by examiner

Primary Examiner—Anh Phung
(74) Attorney, Agent, or Firm—McDermott Will & Emery LLP

(57) ABSTRACT

Activation/inactivation of an internal normal row activation signal for controlling a memory cell selecting operation is controlled in response to leading and trailing edges of an address transition detection signal. When an internal normal row activating signal is activated, generation of an address transition detection signal is masked by mask circuitry. Conflict between an activating operation and an inactivating operation of the normal row activating signal can be prevented and an internal operation can be performed stably. A refresh-control-free dynamic semiconductor memory device having an interface compatible with a static random access memory and capable of stably performing an internal operation is provided.

9 Claims, 24 Drawing Sheets

F I G. 29
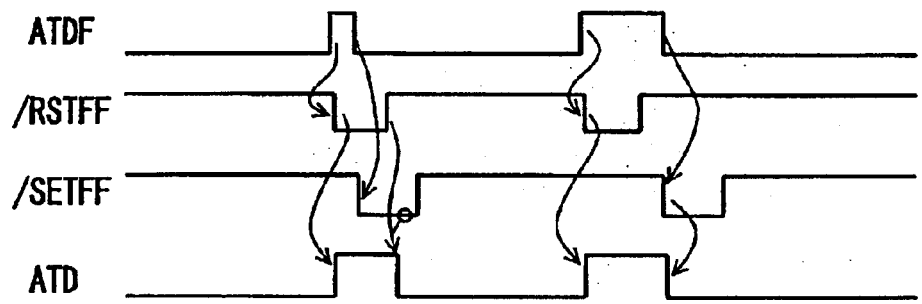
F I G. 30
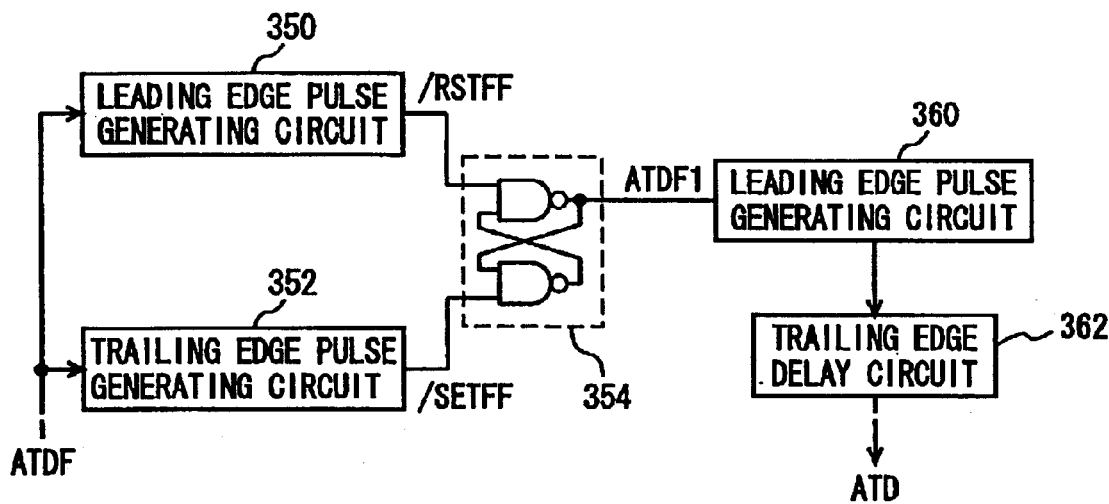

FULLY HIDDEN REFRESH DYNAMIC RANDOM ACCESS MEMORY

BACKGROUND OF THE INVENTION

1. Field of the Invention

The present invention relates to a semiconductor memory device, and more particularly to a fully hidden refresh DRAM (Dynamic Random Access Memory) capable of fully hiding a refresh operation internally executed from an outside. More specifically, the present invention relates to a dynamic type semiconductor memory device having an interface compatible with an SRAM (Static Random Access Memory).

2. Description of the Background Art

In a DRAM (Dynamic Random Access Memory), generally, a single memory cell is constructed by one transistor and one capacitor. The area occupied by the memory cell is therefore small and the DRAM is suitable to implement a memory device of a large storage capacity. However, the DRAM stores information in the form of electric charges in a capacitor. With elapse of time, therefore, the electric charges accumulated in the capacitor leak out and data is lost. To prevent data from being lost due to the leakage of the electric charges, a refreshing operation of periodically rewriting stored data must be executed. In a normal operation mode for performing a data access, an external memory controller controls a timing of executing the refreshing.

On the other hand, in an SRAM (Static Random Access Memory), a single memory cell is constructed by four transistors and two load elements, and the area occupied by the memory cell is larger as compared with a DRAM cell. However, the SRAM cell is basically constructed by a flip flop and stores data as long as the power is supplied, so that refreshing of data does not need to be executed. Therefore, generally in portable equipment or the like, an SRAM is used as a main memory from a viewpoint of controllability.

Also in the field of portable equipment or the like, as the functionality is enhanced, it is demanded to handle a large amount of data such as image data and audio data and to increase the storage capacity of a main memory device sufficiently. In the case of constructing such a memory device of a large storage capacity by an SRAM, the occupied area becomes large, and it greatly hinders reduction in the size of the whole system.

A hidden refresh DRAM requiring no external refresh control is being proposed as a main memory device of a large storage capacity as an substitution of an SRAM. In such a hidden refresh DRAM, a refresh request is issued internally at predetermined intervals and a refreshing operation is executed internally in accordance with the refresh request. When a data access from an outside and the internal refresh request conflict with each other, the operation designated earlier is executed by an arbitration circuit. For example, when a refresh request is supplied at a timing faster than instruction of a data access (data writing or data reading), first, the refresh operation is executed. After completion of the refreshing operation, the data access operation is executed in accordance with the data access instruction from the outside.

The hidden refresh DRAM which does not require an external controller to control a refresh is called a fully hidden refresh DRAM or a VSRAM (Virtual Static RAM). An example of such a memory is disclosed by Sawada et al., "A 30 µA Data-Retention Pseudostatic RAM with Virtually Static RAM Mode", IEEE, Journal of Solid State Circuits, Vol. 23, No. 1, pp. 12 to 17.

In a fully hidden refresh DRAM completely hiding a refresh operation from an outside and requiring no external refresh control, a refresh request is issued by using a built-in timer circuit (refresh timer) at predetermined time intervals. In response to the refresh request, a refresh is executed in accordance with an internally generated refresh address. The refresh timer operates asynchronously with an external data access. When the data access instruction from the outside and the refresh request conflict with each other, data is destructed. It is therefore necessary to arbitrate between the refresh request and the data access request as described above.

In the above-mentioned prior art document, a flip flop is employed, as such an arbitration circuit, to receive both a normal access request generated by a chip enable signal /CE and an internally generated refresh request, and determines which one of the requests is activated faster. As a determination circuit, in the prior art document, an NAND type flip flop is used. Therefore, to successively execute a refresh and a data access when the refresh request and the data access request conflict with each other, even when a signal indicative of one of the requests becomes inactive, it is necessary to maintain the other signal in an active state. Thus, a refresh request activation period becomes longer than a period in which the refresh is executed internally, and the activation period of the data access request signal also has to be set to be longer than the period required for completion of the refreshing operation. Consequently, for example, a command instructing a data access cannot be applied in the form of a one-shot pulse synchronously with a clock signal, as an externally applied data access instruction.

In the prior art document described above, the data access request is activated according to chip enable signal /CE. Therefore, such a problem occurs that the prior art technique cannot be applied to an interface using an address transition detection signal which is commonly widely used in an interface of an SRAM. Specifically, in the document, chip enable signal /CE has to be toggled in accordance with a data access. It is impossible to change an address signal to define a memory cycle by the change in address signal under a state where chip enable signal /CE is fixed at an L level. Therefore, the prior art device cannot accommodate for an address transition detection type interface, and a DRAM having complete compatibility with an SRAM cannot be implemented.

In a case where successive data accesses are performed, in the configuration of the prior art document, the data accesses are accepted continuously. In the technique of the prior art document, a word line is automatically driven to an inactive state after elapse of a predetermined time. However, in the case where the next data access instruction is supplied before the predetermined time elapses, a data access operation is performed before internal circuitry reliably returns to a precharge state, so that a data collision occurs. A problem such that an accurate data access cannot be ensured arises.

A selected word line is maintained in an active state for a predetermined time. Therefore, operation of selecting a row and a column has to be performed in each access cycle. In a DRAM, since data is read destructively, it is required to perform a column selection after the row selecting operation is performed and data of a memory cell is sensed and latched by a sense amplifier and latched. Therefore, it is difficult to successively access different columns under the state where a word line is maintained in a selected state, as in a page mode. A problem such that the high speed access mode cannot be achieved arises.

In the case of detecting a transition in address signal and defining a memory cycle, a countermeasure against noise in an address signal has to be taken. However, since a conventional fully hidden refresh DRAM does not use an address transition detection signal, the problem of noise in the address transition detection signal is not considered.

SUMMARY OF THE INVENTION

An object of the present invention is to provide a DRAM based semiconductor memory device having full compatibility with an SRAM interface.

Another object of the present invention is to provide a fully hidden refresh type DRAM having an address transition detection type interface.

Still another object of the present invention is to provide a fully hidden refresh type DRAM having an address transition detection type interface which operates reliably without being influenced by noise of an address signal.

Yet another object of the present invention is to provide a fully hidden refresh type DRAM capable of operating in a high-speed access mode.

A semiconductor memory device according to a first aspect of the present invention includes: a plurality of memory cells; an operation mode instruction signal generating circuit for generating an operation mode instruction signal; a cell selection control signal generating circuit for generating a cell selection control signal in response to the operation mode instruction signal; a delay circuit for delaying the cell selection control signal; a cell selection activation control signal generating circuit for generating a cell selection activation control signal for controlling an operation of selecting the plurality of memory cells in response to an output signal of the delay circuit; and a mask circuit for prohibiting transfer of the operation mode instruction signal to the cell selection control signal generating circuit in response to the cell selection control signal.

A semiconductor memory device according to a second aspect of the present invention includes: a plurality of memory cells arranged in rows and columns; row address transition detection circuit for detecting a transition in row address signal designating a row of the memory cells and generating a row address transition detection signal; a column address transition detection circuit for detecting a transition in column address signal designating a column of the memory cells and generating a column address transition detection signal; an array activating signal generating circuit for generating an array activating signal for activating/inactivating the memory cell selecting operation in response to the row address transition detection signal; and a column selection control signal generating circuit for generating a column selection activating signal for activating an operation of selecting a column of the memory cells in response to activation of either the array activating signal or the column address transition detection signal.

A semiconductor memory device according to a third aspect of the present invention includes: a plurality of memory cells; an address transition detection circuit for detecting a transition in address signal designating an address of a memory cell in the plurality of memory cells and generating a one-shot address transition detection signal; a pulse width change circuit for changing a pulse width of the address transition detection signal; and a cell selection control signal generating circuit for generating a cell selection control signal for controlling the memory cell selecting operation in response to an output signal of the pulse width change circuit.

By selectively transferring an operation mode instruction signal in accordance with a cell selection control signal to an operation mode instruction signal generating circuit, conflict between a state of the cell selection control signal and a change of a state of the cell selection control signal according to an operation mode instructed by the operation mode instruction signal can be prevented internally. Thus, the internal operation can be executed accurately.

Particularly, in the case of utilizing the address transition detection signal as the operation mode instruction signal, the internal operation reset and the internal operation activating instruction are designated by the leading and trailing edges of the address transition detection signal, respectively, so that activation of the internal operation and inactivation of the internal operation can be prevented from being simultaneously designated. Thus, a semiconductor memory device, operating accurately and having an address transition detection type interface compatible with an SRAM interface, can be implemented.

By utilizing a row address transition detection signal for controlling row selection and a column address transition detection signal for controlling column selection, different column addresses can be successively accessed under a state where a row is maintained in a selected state. Therefore, a high-speed access mode can be implemented in the semiconductor memory device having an address transition detection type interface.

By changing the pulse width of the address transition detection signal, even if the address transition detection signal is insufficient due to noise in an address signal, a pulse signal of a sufficient pulse width can be generated. Thus, a semiconductor memory device having an address transition detection type interface having a large margin against noise in an address signal can be implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 29 is a signal waveform diagram representing an operation of an address transition detection signal generating unit of the main control circuit shown in FIG. 28; and FIG. 30 is a diagram showing a modification of the fifth embodiment of the present invention.

DESCRIPTION OF THE PREFERRED EMBODIMENTS

First Embodiment

Figure 1:
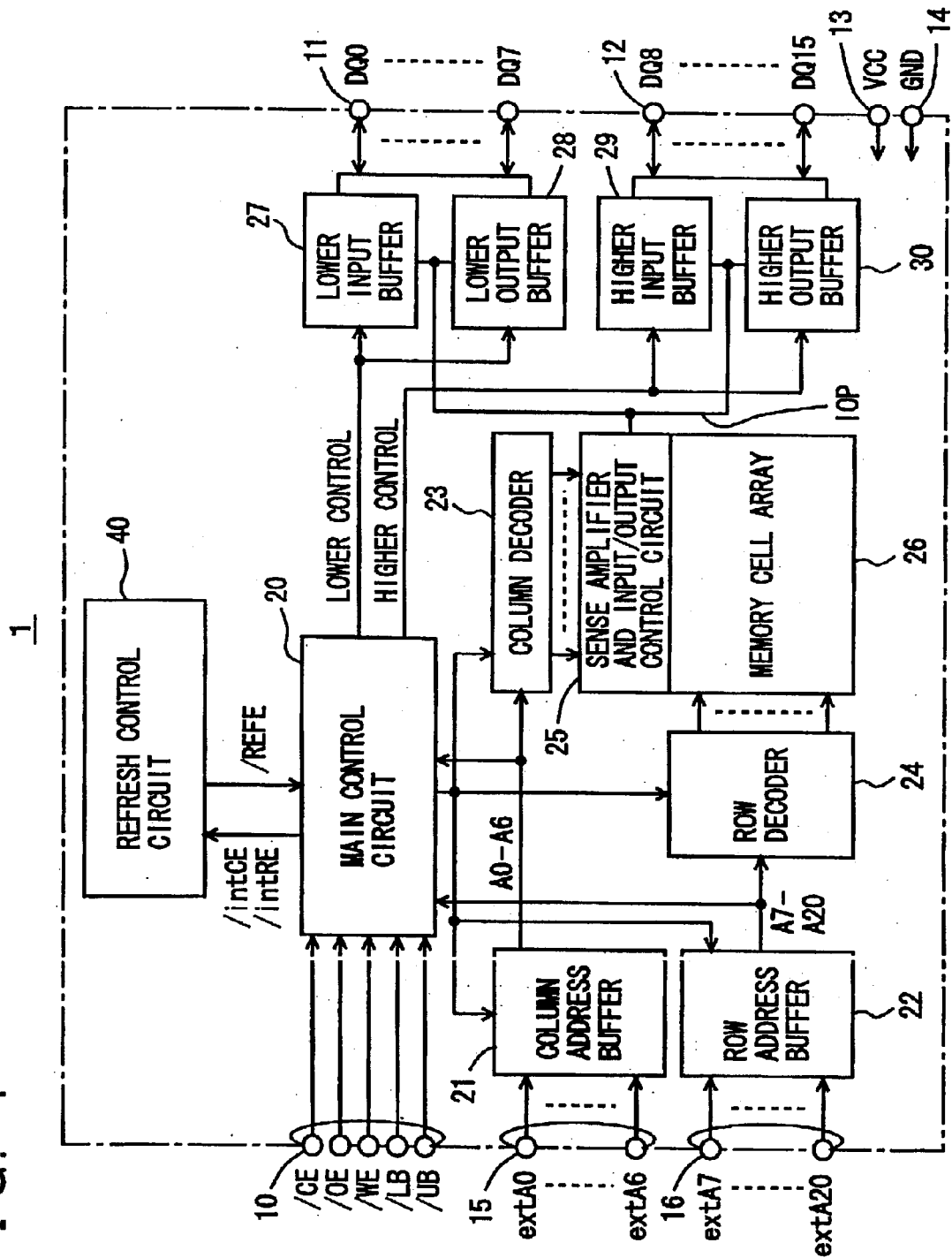
FIG. 1 is a diagram schematically showing the configuration of a whole semiconductor memory device according to the present invention.

FIG. 1 is a diagram schematically showing the whole configuration of a semiconductor memory device according to a first embodiment of the present invention. In FIG. 1, a semiconductor memory device 1 includes a main control circuit 20 receiving a chip enable signal /CE, an output enable signal /OE, a write enable signal /WE, a lower byte enable signal /LB, and an upper byte enable signal /UB which are supplied via a control input terminal group 10, and generating signals for controlling various internal operations.

Chip enable signal /CE indicates that semiconductor memory device 1 is selected and set in a data accessible state. Output enable signal /OE instructs outputting of data. Write enable signal /WE instructs writing of data.

Semiconductor memory device 1 inputs/outputs, as an example, data DQ0 to DQ15 of 16 bits. Lower byte enable signal /LB indicates that lower byte data DQ0 to DQ7 is valid. Upper byte enable signal /UB indicates that upper byte data DQ6 to DQ15 is valid.

Semiconductor memory device 1 further includes: a column address buffer 21 receiving address bits A0 to A6 supplied via an address input terminal group 15 and generating internal column address signal bits A0 to A6 under control of main control circuit 20; and a row address buffer 22 for buffering external address bits extA7 to extA20 supplied via a row address input terminal group 16 and generating internal row address bits A7 to A20 under control of main control circuit 20. External address bits extA0 to extA20 are simultaneously supplied. In a manner similar to a normal SRAM, when output enable signal /OE or write enable signal /WE is made active in activation of chip enable signal /CE, external address bits extA0 to extA20 are incorporated by column address buffer 21 and row address buffer 22, and internal column address bits A0 to A6 and internal row address bits A7 to A20 are generated.

Internal address bits A0 to A20 are also supplied to main control circuit 20. Main control circuit 20, of which internal configuration will be described in detail later, controls operation of starting/completing a memory cell selecting operation in accordance with a transition in address bits A0 to A20. Specifically, an address transition detection signal ATD is used as a triggering signal of the start and end of an internal operation.

Semiconductor memory device 1 further includes: a memory cell array 26 having a plurality of memory cells arranged in rows and columns; a row decoder 24 for decoding internal row address bits A7 to A20 from row address buffer 22 and driving an addressed row in memory cell array 26 to a selected state; a column decoder 23 for decoding internal column address bits A0 to A6 from column address buffer 21 and generating a column selection signal for selecting an addressed column in memory cell array 26; sense amplifiers for sensing, amplifying and latching data of memory cells in the selected row in memory cell array 26; and an input/output control circuit for coupling the addressed column in memory cell array 26 to an internal data bus IOP in accordance with the column selection signal from column decoder 23. In FIG. 1, sense amplifiers and input/output control circuit (column selection circuit) are shown by a block 25.

Semiconductor memory device 1 further includes a lower input buffer 27 and a lower output buffer 28 provided for a lower byte data terminal group 11, and a higher input buffer 29 and a higher output buffer 30 provided for an upper byte data terminal group 12.

When activated, lower input buffer 26 buffers lower byte data bits DQ0 to DQ7 supplied to lower byte data terminal group 11, and generates and transmits lower internal write data bits to internal data bus IOP. When activated, lower output buffer 28 generates external lower byte data bits DQ0 to DQ7 from data transmitted to internal data bus IOP for transmission through lower byte data terminal group 11.

When activated, higher input buffer 29 buffers upper byte data bits DQ8 to DQ15 supplied to upper byte data terminal group 12, and generates and transmits higher internal write data bits to internal data bus IOP. When activated, higher output buffer 30 buffers internal upper byte data transmitted to internal data bus IOP, and generates upper byte data bits DQ8 to DQ15 for transmission to upper byte data terminal group 12.

Semiconductor memory device 1 further includes a refresh control circuit 40 receiving an internal chip enable signal /intCE and an internal normal row activating signal /intRE from main control circuit 20 and, when refresh can be executed, generating and supplying a refresh activating signal /REFE to main control circuit 20.

Internal normal row activating signal /intRE indicates that the memory cell array is internally selected. Specifically, internal normal row activating signal /intRE is maintained in an active state during memory cell array 26 is in a selected state (including a recovery period in which memory cell array recovers to the initial state), thereby determining one memory cycle.

When refresh activating signal /REFE is activated, main control circuit 20 executes a refreshing operation on memory cell array 20. In FIG. 1, a circuit for generating a refresh address for refreshing and a multiplexer for switching between an internal row address from row address buffer 22 and the refresh address are not shown for simplifying the drawing.

Refresh control circuit 40 includes a timer, and issues a refresh request at predetermined intervals in accordance with a counting operation of the timer. The refresh request is issued asynchronously with a data access instruction supplied externally. By generating refresh activating signal /REFE in refresh control circuit 40 in accordance with the refresh request, internal chip enable signal /intCE, and internal normal row activating signal /intRE, conflict between the refresh operation and a normal data access is prevented.

Further, when the data access instruction is supplied in a state where refresh activating signal /REFE is active, main control circuit 20 performs a control of shifting the timing of a normal data access to completion of the refreshing. Usually, the data access instruction is designated by setting chip enable signal /CE, write enable signal /WE and output enable signal /OE to an active state. In the first embodiment, a transition in the address signal supplied currently is detected, the address transition detection signal is generated, and normal row activating signal /intRE is controlled to be active/inactive in accordance with the address transition detection signal.

Figure 2:
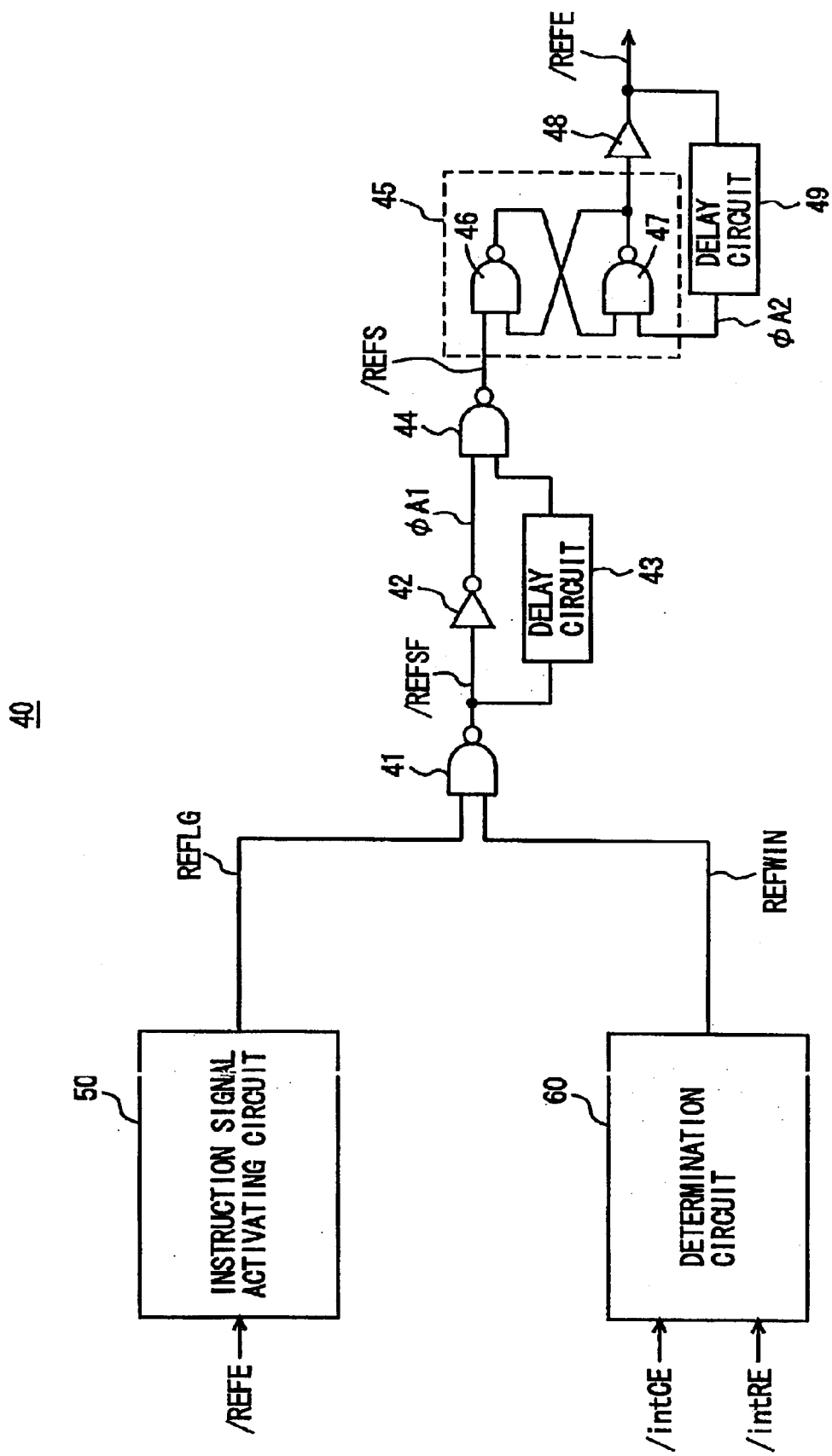
FIG. 2 is a diagram schematically showing the configuration of a refresh control circuit shown in FIG. 1.

FIG. 2 is a diagram showing the configuration of refresh control circuit 40 shown in FIG. 1. In FIG. 2, refresh control circuit 40 includes: an instruction signal activation circuit 50 for generating a refresh flag REFLG indicating that the refresh request is issued; a determination circuit 60 for receiving internal chip enable signal /intCE and internal normal row activating signal /intRE, and generating a refresh window signal REFWIN for determining a period for determining whether refreshing is executable; and a refresh activation circuit for generating refresh activating signal /REFE in accordance with refresh flag REFLG from instruction signal activation circuit 50 and refresh window signal REFWIN.

Refresh activation circuit includes: an NAND circuit 41 receiving refresh flag REFLG and refresh window signal REFWIN; an inverter 42 inverting an output signal of NAND circuit 41; a delay circuit 43 for delaying an output signal /REFSF of NAND circuit 41 by a predetermined time; an NAND circuit 44 receiving an output signal φA1 of inverter 42 and an output signal of delay circuit 43 and generating a signal /REFS; a set/reset flip flop 45 that is set in response to activation of output signal /REFS of NAND circuit 44; a buffer circuit 48 for buffering an output signal of set/reset flip flop 45 and generating refresh activating signal /REFE; and a delay circuit 49 for generating a reset signal φA2 through delaying of a refresh activating signal REFE outputted from buffer circuit 48 by a predetermined time and resetting set/reset flip flop 45.

By inverter 42, delay circuit 43 and NAND circuit 44, a one-shot pulse generating circuit for generating a one-shot pulse signal in response to the falling edge of output signal /REFSF of NAND circuit 41 is constructed.

Refresh flag REFLG is set when a refresh request is issued in a predetermined period in instruction signal activation circuit 50 and is reset when the refreshing operation is completed. Therefore, when refresh flag REFLG is set, it indicates that refresh has to be executed.

Figure 3:
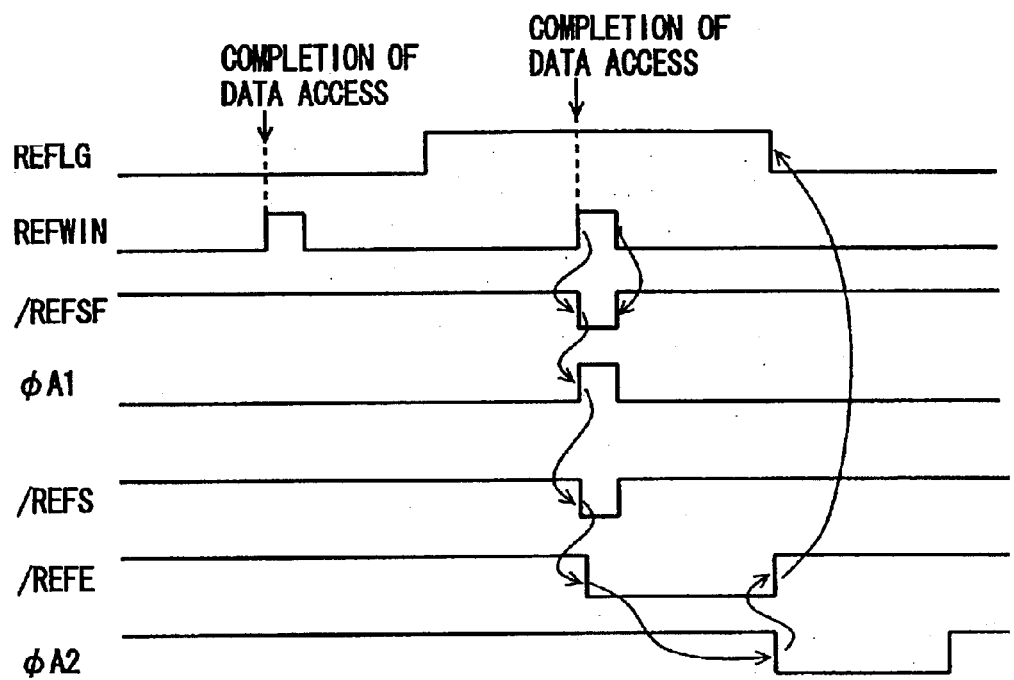
FIG. 3 is a signal waveform diagram representing an operation of a refresh control circuit shown in FIG. 2.

FIG. 3 is a diagram schematically representing an operation of refresh control circuit 40 shown in FIG. 2. In FIG. 3, the state of internal normal row activating signal /intRE is not considered. When internal normal row activating signal /intRE is made inactive on completion of an internal data access, determination circuit 60 sets refresh window signal REFWIN to the H level for a predetermined time and sets a period of determining whether a refresh can be performed subsequent to the data access.

On completion of the data access, refresh window signal REFWIN from determination circuit 60 is set to the H level for a predetermined period. If refresh flag REFLG from instruction signal activating circuit 50 is at the L level, output signal /REFSF of NAND circuit 41 maintains the H level and the state of set/reset flip flop 45 does not change. Therefore, refresh activating signal /REFE also maintains the H level, and a refresh is not executed.

When the refresh request is issued internally in instruction signal activation circuit 50, refresh flag REFLG rises to the H level. On completion of the data access, refresh window signal REFWIN from determination circuit 60 rises to the H level. If refresh flag REFLG is at the H level, output signal /REFSF of NAND circuit 41 turns L level and, accordingly, output signal φA1 of inverter 42 rises to the H level. Since an output signal of delay circuit 43 is at the H level yet at this time, output signal /REFS of NAND circuit 44 turns L level, set/reset flip flop 45 is set, and refresh activating signal /REFE turns L level to be active. During an active period of refresh activating signal /REFE, a refresh is internally executed.

After elapse of delay time of delay circuit 49, output signal φA2 of delay circuit 49 turns L level, accordingly, set/reset flip flop 45 is reset, and refresh activating signal /REFE is made inactive, thereby completing the refresh. In response to the inactivation of refresh activating signal /REFE, refresh flag REFLG is made inactive in instruction signal activation circuit 50 to indicate that there is no refresh in a waiting state.

Therefore, when a data access is executed internally, refresh window signal REFWIN is made active upon completion of the data access and the state of refresh flag REFLG is determined. By executing a refresh in accordance with a result of determination, even when a refresh request is issued in execution of a data access, the refresh is not performed until the data access is completed. Thus, conflict between the refresh and the data access can be prevented.

Figure 4:
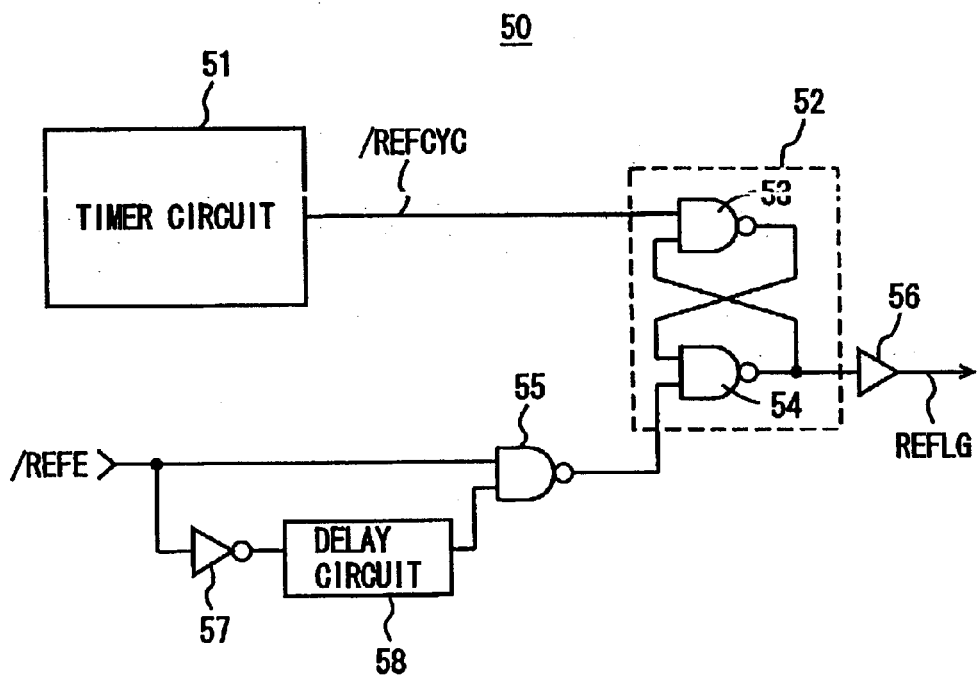
FIG. 4 is a diagram showing an example of the configuration of an instruction signal activation circuit shown in FIG. 2.

FIG. 4 is a diagram showing an example of the configuration of instruction signal activation circuit 50 shown in FIG. 2. In FIG. 4, instruction signal activation circuit 50 includes a timer circuit 51 for generating a refresh cycle signal (refresh request) /REFCYC at predetermined cycles, an inverter 57 for inverting refresh activating signal /REFE, a delay circuit 58 for delaying an output signal of inverter 57 by a predetermined time, a NAND circuit 55 receiving an output signal of delay circuit 58 and refresh activating signal /REFE, a flip flop 52 set in response to activation (falling) of refresh cycle signal /REFCYC and reset in response to activation (falling) of an output signal of NAND circuit 55, and an inverter 56 for inverting an output signal of flip flop 52 to generate refresh flag REFLG.

Inverter 57, delay circuit 58, and NAND circuit 55 construct a rising-edge one-shot pulse generating circuit and, in response to inactivation of refresh activating signal /REFE, generate a one-shot pulse signal having a pulse width corresponding to the delay time of delay circuit 58.

Timer circuit 51 is constructed by, for example, a ring oscillator and a counter circuit for counting an oscillation signal of the ring oscillator, and activates refresh cycle signal /REFCYC each time a count reaches a predetermined value.

Set/reset flip flop 52 is set when refresh cycle signal /REFCYC is made active to set refresh flag REFLG. When refresh activating signal /REFE is made inactive, set/reset flip flop 52 resets refresh flag REFLG. By determining whether a refresh can be executed using refresh flag REFLG on the basis of refresh window signal REFWIN from determination circuit 60 shown in FIG. 2, a first countermeasure for preventing conflict between the refresh and the data access is achieved.

Figure 5:
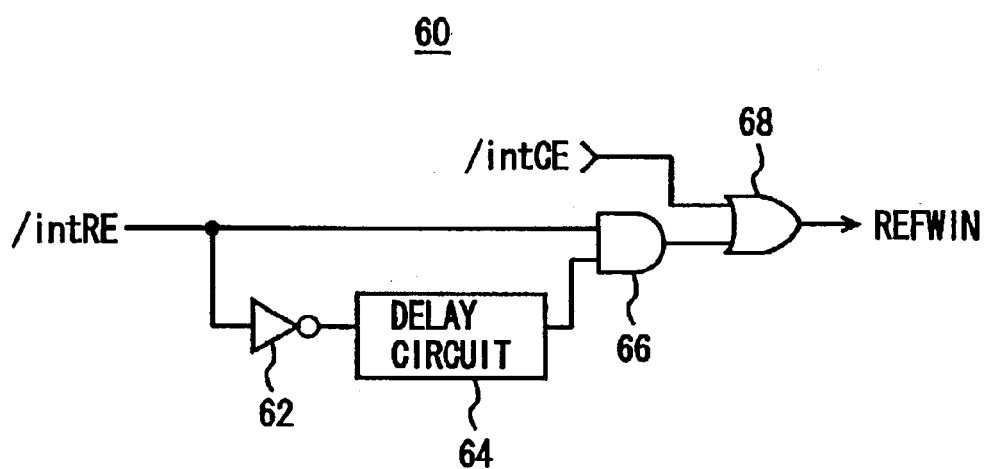
FIG. 5 is a diagram showing an example of the configuration of a determination circuit shown in FIG. 2.

FIG. 5 shows an example of the configuration of determination circuit 60 shown in FIG. 2. In FIG. 5, determination circuit 60 includes an inverter 62 receiving internal normal row activating signal /intRE, a delay circuit 64 for delaying an output signal of inverter 62, an AND circuit 66 receiving an output signal of delay circuit 64 and internal normal row activating signal /intRE, and an OR circuit 68 receiving an output signal of AND circuit 66 and internal chip enable signal /intCE and generating refresh window signal REFWIN.

Inverter 62, delay circuit 64 and AND circuit 66, in combination, construct a one-shot pulse generating circuit for generating a one-shot pulse in response to the rising edge of internal normal row activating signal /intRE. Internal normal row activating signal /intRE is activated when a data access is executed and rises to the H level on completion of an internal memory array activate period, thereby indicating completion of the data access. Therefore, when internal normal row activating signal /intRE is in the active state (the L level), it is indicated that the memory cell array is in the selected state or has not yet recovered to the initial state (precharge state).

Figure 6:
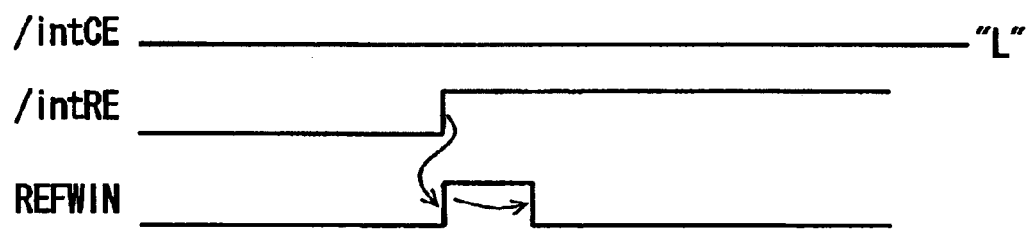
FIG. 6 is a signal waveform diagram representing an operation of a determination circuit shown in FIG. 5.

As shown in FIG. 6, when a data access is completed internally in a state where internal chip enable signal /intCE is at the L level and the semiconductor memory device is in a selected state, refresh window signal REFWIN is set to the H level for a predetermined period, thereby providing a timing of determining whether a refresh is to be executed.

When internal chip enable signal /intCE is at the H level, refresh window signal REFWIN from OR circuit 68 is at the H level. Therefore, when the semiconductor memory device is not selected and a data access is not performed, a refresh is executed in accordance with refresh window signal /REFCYC from timer circuit 51 shown in FIG. 4.

Figure 7:
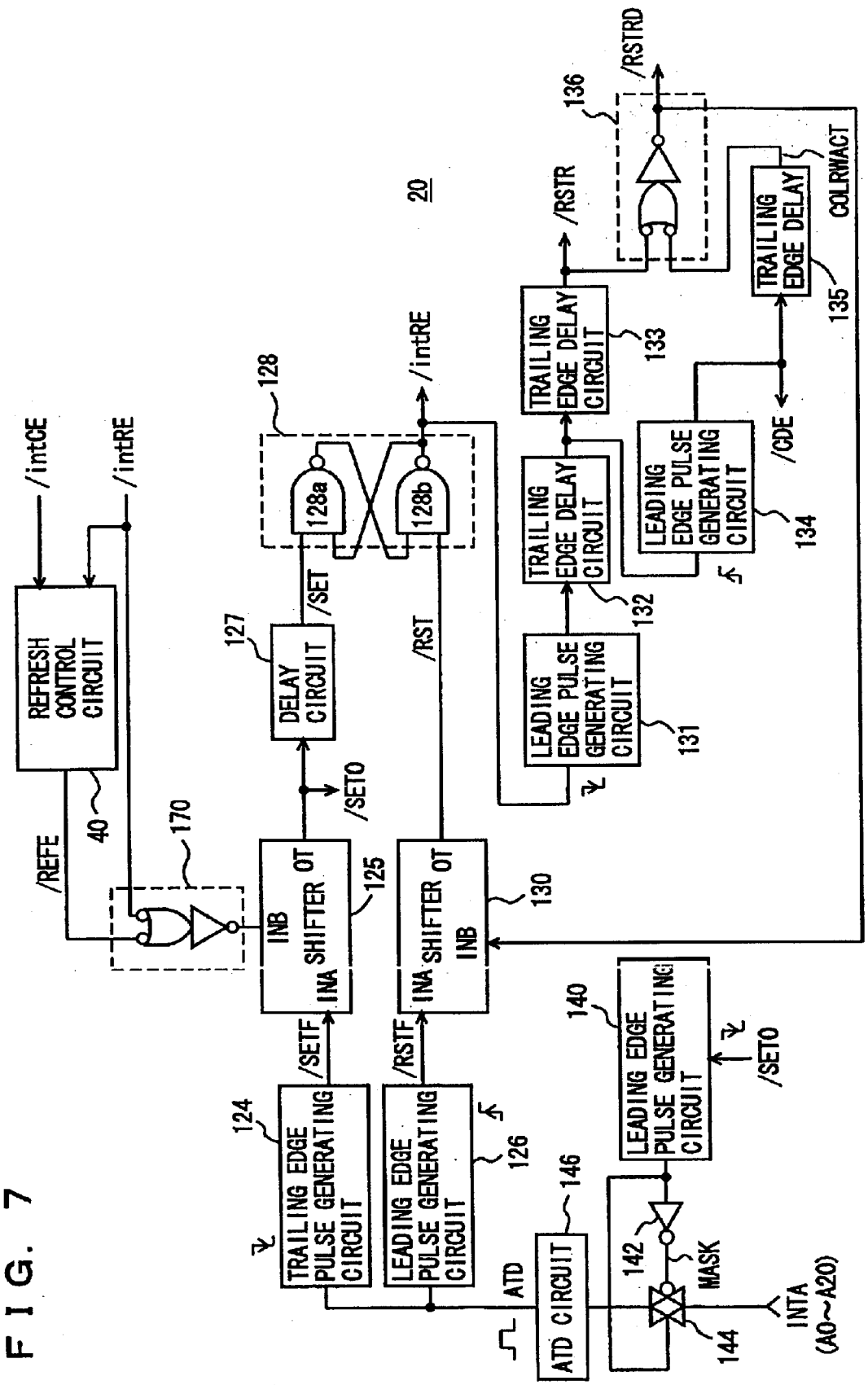
FIG. 7 is a diagram schematically showing the configuration of a main control circuit according to a first embodiment of the present invention.

FIG. 7 is a diagram schematically showing the configuration of main control circuit 20 according to the first embodiment of the present invention. In FIG. 7, main control circuit 20 includes: a trailing edge pulse generating circuit 124 for generating a one-shot pulse in response to the trailing edge of address transition detection signal; a leading edge pulse generating circuit 126 for generating a one-shot pulse signal in response to the leading edge (rising edge) of address transition detection signal ATD; a composite AND gate 170 receiving refresh activating signal /REFE outputted from refresh control circuit 40 and internal normal row activating signal /intRE; a shifter 125 for shifting a pulse signal /SETF outputted from trailing edge pulse generating circuit 124 until inactivation of an output signal of composite AND gate 170; a delay circuit 127 for delaying an output signal /SET0 of a shifter 125 by a predetermined time; a shifter 130 for shifting activation of pulse signal /RSTF outputted from leading edge pulse generating circuit 126 until inactivation of a delayed restore period signal /RSTRD; and a flip flop 128 set in response to an output signal /SET of delay circuit 127 reset in response to a reset signal /RST from shifter 130.

Address transition detection signal ATD is generated in a one-shot pulse signal form by ATD circuit 146 in response to a transition in an address signal. Composite AND gate 170 outputs a signal of the L level when either refresh activating signal /REFE or internal normal row activating signal /intRE is at the L level. When output pulse /SETF of trailing edge pulse generating circuit 124 is made active in a state where an output signal of composite AND gate 170 is at the L level, shifter 125 delays activation of its output signal /SET0 until the output signal of composite AND gate 170 turns H level.

Shifter 130 operates similarly. When delayed restore period signal /RSTRD attains the H level, it is indicated that the internal state returns to the precharge state. Therefore, in the case where a memory cell is selected internally, shifter 125 delays activation of its output signal /SET0 until the internal state recovers to a non-selection state (precharge state). Similarly, shifter 130 activates its reset signal /RST when delayed restore period signal /RSTRD attains the H level and the internal state recovers to the precharge state with reliability.

Therefore, when address transition detection signal ATD is generated, after delayed restore period signal /RSTRD is made inactive, reset signal /RST is made active, and internal normal row activating signal /intRE is made inactive. Then, the signal /SET0 is activated, internal normal row activating signal /intRE is activated again, and a new memory cycle is started.

When address transition detection signal ATD is generated in execution of a refresh, first, reset signal /RST is activated. In a refresh operation, normal row activating signal /intRE is in an inactive state. Therefore, even if reset signal /RST is activated, no influence is exerted on the refreshing operation. After completion of the refreshing operation, when refresh activating signal /REFE is made inactive, the output signal /SET0 of shifter 125 is activated, internal normal row activating signal /intRE is activated, and a memory cycle is started.

Flip flop 128 includes cross-coupled NAND gates 128a and 128b. Set signal /SET from delay circuit 127 is supplied to a first input of NAND gate 128a and reset signal /REST is supplied to a second input of NAND gate 128b. An output of NAND gate 128a is connected to a first input of NAND gate 128b, and an output of NAND gate 128b is connected to a second input of NAND gate 128a. Internal normal row activating signal /intRE is outputted from NAND gate 128b.

Main control circuit 20 further includes: a leading edge pulse generating circuit 131 for generating a one-shot pulse signal in response to the leading edge (falling edge) of internal normal row activating signal /intRE; a trailing edge delay circuit 132 for delaying the trailing edge of an output pulse of leading edge pulse generating circuit 131 to expand the pulse width; a trailing edge delay circuit 133 for further delaying the trailing edge of an output pulse signal of trailing edge delay circuit 132 to expand the pulse width and generating restore period signal /RSTR; a leading edge pulse generating circuit 134 for generating a one-shot pulse signal in response to the leading edge of an output signal of trailing edge delay circuit 132; a trailing edge delay circuit 135 for delaying the trailing edge of an output pulse of leading edge pulse generating circuit 134; and a composite AND gate 136 receiving output signals of trailing edge delay circuits 133 and 135 and generating delayed restore period signal /RESRD.

The output pulse of leading edge pulse generating circuit 134 is used as a column activating signal /CDE to activate circuitry related to selection of a column. A pulse signal outputted from trailing edge delay circuit 135 is a column recovery period signal COLRWACT and assures a period of recovery to the initial state of the column-related circuitry.

Therefore, internal normal row activating signal /intRE defines a period (including the period of recovery to pre-charge state) in which a row is in a selected state internally, and indicates that the internal state recovers to the initial state, when inactivated.

A memory cell is a DRAM cell and data is destructively read out. Restore period signal /RSTR defines a period (restore period) since internal reading out of memory cell data until rewriting of the read out data into the memory cell.

In the configuration shown in FIG. 7, owing to provision of shifters 125 and 130, in the case where a next data access instruction is supplied during the period in which the restoring operation is internally performed or during the column recovery period, the next data access is not accepted until the restoring operation or column recovery period is completed. Thus, after the internal state is recovered to the initial state with reliability, the next operation can be started, and internal data can be prevented from being destroyed.

Main control circuit 20 further includes: a leading edge pulse generating circuit 140 for generating a one-shot pulse signal in response to the leading edge (falling) of output signal /SET0 of shifter 125; an inverter 142 for inverting an output signal of leading edge pulse generating circuit 140 to generate a mask signal MASK; a transmission gate 144 which is made nonconductive when mask signal MASK outputted from inverter 142 is at the H level; and an ATD circuit 146 for generating address transition detection signal ATD in the form of a one-shot pulse in response to a transition in an internal address signal INTA (external address signal bits A0 to A20) supplied via transmission gate 144.

Therefore, when the signal /SET0 from shifter 125 attains to the L level, leading edge pulse generating circuit 140 generates a one-shot pulse signal, and mask signal MASK attains to the H level, transfer of internal address signal INTA to ATD circuit 146 is inhibited. As will be described in detail later, a state causing the set signal /SET and reset signal RST to be simultaneously supplied to set/reset flip flop 128 is prevented from occurring and the internal operation is reset with reliability. Then, the next new operation is started.

Figure 8:
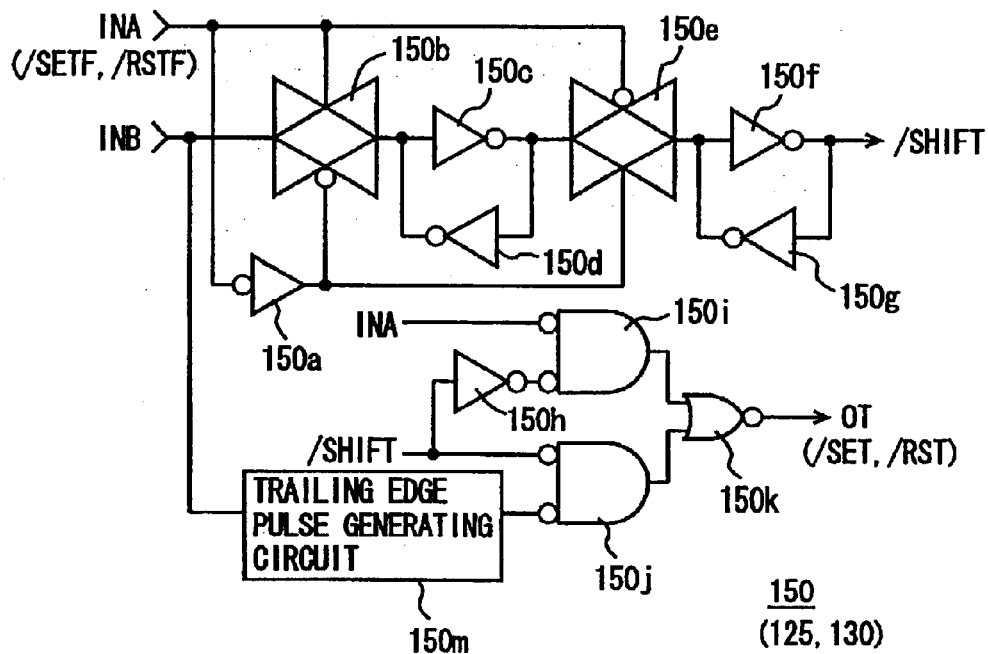
FIG. 8 is a diagram showing an example of the configuration of a shifter shown in FIG. 7.

FIG. 8 is a diagram showing an example of the configuration of shifters 125 and 130 shown in FIG. 7. Since shifters 125 and 130 have the same configuration, shifter 150 is shown in FIG. 8 as a representative.

In FIG. 8, shifter 150 includes: an inverter 150a receiving a signal (/SETF or /RSTF) supplied to an input node INA; a CMOS transmission gate 150b which is selectively made conductive in accordance with an output signal of 150a and a signal supplied to input node INA and, when conductive, transmits either an output signal of composite AND gate 170 or delayed restore period signal (/RSTRT) in accordance with a signal supplied to an input INB; an inverter 150c for inverting a signal supplied via CMOS transmission gate 150b; an inverter 150d which is connected in anti-parallel to inverter 150c and transmits an output signal of inverter 150c to the input of inverter 150c; and a CMOS transmission gate 150e which is selectively made conductive in accordance with an output signal of inverter 150a and a signal supplied to input node INA.

CMOS transmission gates 150b and 150e turn conductive complementary to each other. When made conductive, CMOS transmission gate 150e transmits an output signal of inverter 150c. When a signal supplied to input node INA attains to the L level, CMOS transmission gate 150a is made nonconductive. When the signal at input node INA attains to the H level, CMOS transmission gate 150e enters a nonconductive state.

Shifter 150 further includes an inverter 150f for inverting a signal from CMOS transmission gate 150e, and an inverter 150g. Inverters 150f and 150g construct a latch circuit. According to a signal /SHIFT from inverter 150f, whether a timing of transmitting a signal (/SETF or /RSTF) supplied to input node INA is shifted is designated.

Specifically, when a signal supplied to input node INA is activated, by CMOS transmission gates 150b and 150e and inverters 150c, 150d, 150f and 150g, whether a signal supplied to input node INB is active is determined. According to the determination result, shift control signal /SHIFT is generated.

Shifter 150 further includes an inverter 150h for inverting shift control signal /SHIFT, a trailing edge pulse generating circuit 150m for generating a one-shot pulse signal in response to the trailing edge (rising) of a signal supplied to input node INB; an NOR gate 150j receiving shift control signal /SHIFT and an output signal of trailing edge pulse generating circuit 150m; an NOR gate 150i receiving an output signal of inverter 150h and a signal supplied to input node INA; and an NOR circuit 150k receiving output signals of NOR gates 150i and 150j and generating an output signal (/SET0 or /RST) to an output node OT.

When shift control signal /SHIFT is at the L level, a signal is generated to output node OT in accordance with an output signal of trailing edge pulse generating circuit 150m. On the other hand, when shift control signal /SHIFT is at the H level, a signal is generated at output node OT in accordance with the signal supplied to input node INA. According to signal /SET or /RST at output node OT, whether internal row activating signal /intRE is made active or inactive is set.

Figure 9A:
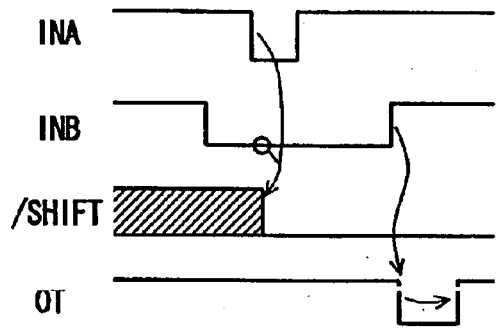
FIGS. 9A and 9B are signal waveform diagrams representing operations of a shifter shown in FIG. 8.
Figure 9B:
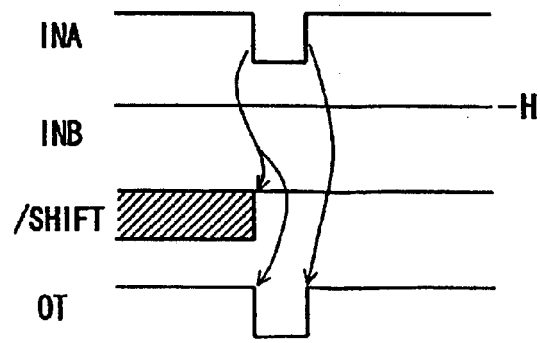

FIGS. 9A and 9B are timing charts representing operations of shifter 150 shown in FIG. 8. Referring to FIGS. 9A and 9B, the operation of shifter 150 shown in FIG. 8 will be briefly described.

Referring to FIG. 9A, a case that a signal supplied to input node INA is made active when a signal supplied to input node INB is at the L level will be considered. During a period in which the signal supplied to input node INA is at the H level, CMOS transmission gate 150b is conductive, CMOS transmission gate 150e is nonconductive, and an output signal of inverter 150c attains to the H level in accordance with the signal supplied to input node INB.

Subsequently, the signal supplied to input node INA falls to the L level. CMOS transmission gate 150b becomes nonconductive, CMOS transmission gate 150e becomes conductive, and shift control signal /SHIFT from inverter 150f falls to the L level. When a signal supplied to input node INA rises to the H level, CMOS transmission gate 150e becomes nonconductive, and shift control signal /SHIFT maintains the L level by inverters 150f and 150g.

When shift control signal /SHIFT turns L level, even if the signal at input node INA attains to the L level, NOR gate 150i outputs a signal at the L level. On the other hand, in response to the trailing edge (rising) of the signal at input node INB, trailing edge pulse generating circuit 150m generates a one-shot pulse signal. According to an output signal of trailing edge pulse generating circuit 150m, NOR gate 150j generates a one-shot pulse signal (L-level signal) to output node OT.

Therefore, when the signal at input node INA falls to the L level, if the signal at input node INB is at the L level, activation of the signal at output node OT is shifted until the signal at input node INB is made inactive.

On the other hand, as shown in FIG. 9B, when the signal supplied to input node INA falls to the L level, if the signal supplied to input node INB is at the H level, shift control signal /SHIFT maintains the H level. Therefore, in this case, since the output signal of inverter 150h shown in FIG. 6 attains the L level, in response to the falling of the signal at input node INA, the output signal of NOR gate 150i attains to the H level and, accordingly, the signal from NOR gate 150k to output node OT attains to the L level.

Therefore, according to the logic level of the signal at input node INB upon falling of the signal supplied to input node INA, a timing of activating an output signal of shifter 150 is selectively shifted, and the setting/resetting timing of set/reset flip flop 128 is adjusted. When the signal supplied to input node INA falls from the H level to the L level to instruct a data access, shifter 150 determines the logic level of a signal supplied to input node INB to discriminate whether a memory cell row is in a selected state, and generates shift control signal /SHIFT in accordance with the result of discrimination.

According to shift control signal /SHIFT, one of the signal supplied to input node INA and the signal generated upon inactivation of the signal supplied to input node INB is selected.

According to output signal /SET0 of shifter 125, set/reset flip flop 128 is set via delay circuit 127. According to internal normal row activating signal /intRE from set/reset flip flop 128, a data accessing operation is made active. Therefore, even if the data access instruction is supplied during memory cell row selection, after the selected row is driven to a non-selection state internally, a new data access can be made. Consequently, for example, conflict between the refresh operation and the data accessing operation can be avoided, flip flop 128 is prevented from being set and then reset when internal normal row activating signal /intRE is in an active state. After a data access in the preceding cycle is completed with reliability, a new data access cycle can be started.

Similarly, when a reset instruction is supplied by shifter 130, reset signal /RST from shifter 130 is activated, and internal normal row activating signal /intRE is inactivated in a state where delayed restore period signal /RSTRD is inactive. Therefore, it can be prevented that internal normal row activating signal /intRE is inactivated during a period of recovery to the precharge state and the recovery operation is interrupted.

Figure 10:
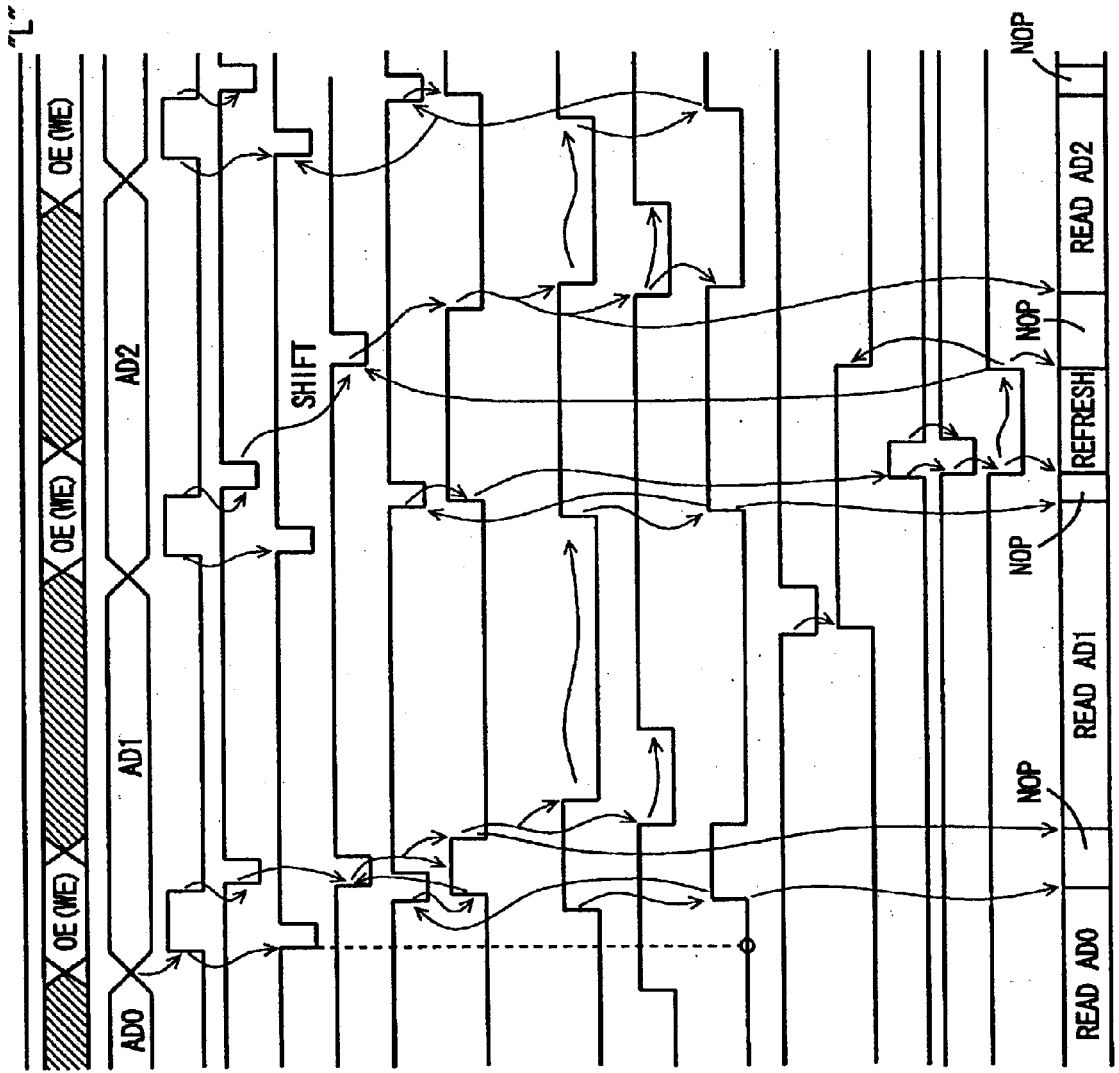
FIG. 10 is a signal waveform diagram representing an operation of a main control circuit shown in FIG. 7.

FIG. 10 is a diagram showing signal waveforms in a memory cell selecting operation of main control circuit 20 shown in FIG. 7. In FIG. 10, mask signal MASK is not shown for simplifying the diagram. Referring to FIG. 10, the operation of main control circuit 20 shown in FIG. 7 will now be described in the below.

A case is considered where address transition detection signal ATD is generated when delayed recovery period signal /RSTRD is active before completion of the recovering operation. In this state, reset fast signal /RSTF from leading edge pulse generating circuit 126 falls from the H level to the L level in response to address transition detection signal ATD. However, since delayed recovery period signal /RSTRD is at the L level, shifter 130 shifts the timing of activating reset signal /RST. Therefore, after delayed restore period signal /RSTRD attains to the H level, reset signal /RST from shifter 130 is activated and set/reset flip flop 128 is reset.

In response to activation of reset signal /RST, internal normal row activating signal /intRE from set/reset flip flop 128 is made inactive to attain to the H level. Accordingly, an output signal of composite AND gate 170 attains to the H level. When address transition detection signal ATD falls to the L level and set fast signal /STEF from trailing edge pulse generating circuit 124 is made active, the signal (set control signal) /SET0 from shifter 125 is activated.

Set control signal /SET0 from shifter 125 is supplied as set signal /SET to flit flop 128 via delay circuit 127. Therefore, such a state is prevented from occurring that both reset signal RST and set signal /SET become active and set signal /SET incompletely designates the setting of set/reset flip flop 128. Specifically, after reset signal /RST enters an inactive state of the H level, set signal /SET from delay circuit 127 is activated, flip flop 128 is set, and internal normal row activating signal /intRE is activated. Thus, a data reading operation according to the next address AD1 can be executed accurately (in the case where a data access is data reading).

In the following description, a state where data reading is designated as a data access is assumed.

A state where refresh cycle signal /REFCYC is activated during an access to address AD1 and refresh flag REFLG is set will be considered.

In an access cycle, in response to activation of normal row activating signal /intRE, leading edge pulse generating circuit 131 generates a one-shot pulse signal and, accordingly, restore period signal /RSTR is activated. According to activation of restore period signal /RSTR, delayed restore period signal /RSTRD is activated. By activation of internal normal row activating signal /intRE, it is indicated that a memory cell row is selected internally, and that an operation of restoring data of the selected memory cells is performed. Restore period signal /RSTR is maintained active for delay time of trailing edge delay circuits 132 and 133. By restore period signal /RSTR, a period necessary to complete the restore of data of the memory cell is ensured.

On the other hand, when an output signal of trailing edge delay circuit 132 rises to the H level, column activating signal /CDE from leading edge pulse generating circuit 104 is activated and a column selecting operation is performed. The rising of the output signal of trailing edge delay circuit 132 indicates that the sensing operation is completed and a column interlock period is terminated.

Column selecting operation is performed in accordance with activation of column activating signal /CDE, and column access activating signal COLRWACT maintains the active state (L level) for this period.

After elapse of the delay time provided by trailing edge delay circuit 135, column recovery period signal COL- RWACT is made inactive, accordingly, delayed restore period signal /RSTRD is made inactive, shifter 130 activates reset signal /RST, and internal normal row activating signal /intRE is made inactive, thereby completing the data access cycle to address AD1.

In response to inactivation of internal normal row activating signal /intRE, refresh window signal REFWIN from determination circuit 60 shown in FIG. 5 is activated for a predetermined period, and whether a refresh is to be executed is determined. Since refresh flag REFLG is at the H level, refresh set signal /REFS shown in FIG. 2 is set to the L level for a predetermined period. Accordingly, set/reset flip flop 45 is set, refresh activating signal /REFE is activated, and the refreshing operation is executed.

When an instruction of accessing the next address AD2 is supplied during an active period of refresh activating signal /REFE, shifter 125 performs a shifting operation. After refresh activating signal /REFE is inactivated, shifter 125 activates set control signal /SET0. After elapse of a predetermined period since set control signal /SET0 is activated, set signal /SET is activated, set/reset flip flop 128 is set, and internal normal row activating signal /intRE is activated. Accordingly, restore signal /RSTR is activated, delayed restore period signal /RSTRD is activated, according to address AD2, an operation of selecting a memory cell row and a memory cell column is executed, and reading of data (when output enable signal OE is activated) is performed.

Inactivation of internal normal row activating signal /intRE is controlled by delayed restore period signal /RSTRD, thereby enabling ensuring a period of precharging by row related circuitry and a column related circuitry. The next operation is allowed to be executed only after completion of the restoring and recovering operations with reliability.

By providing delay circuit 127, reset signal /RSET and set signal /SET are prevented from being simultaneously activated in successive access cycles. After internal normal row activating signal /intRE is made inactive reliably, flip flop 128 can be is set to activate internal normal row activating signal /intRE again. Next, the function of mask signal MASK will be described.

Figure 11:
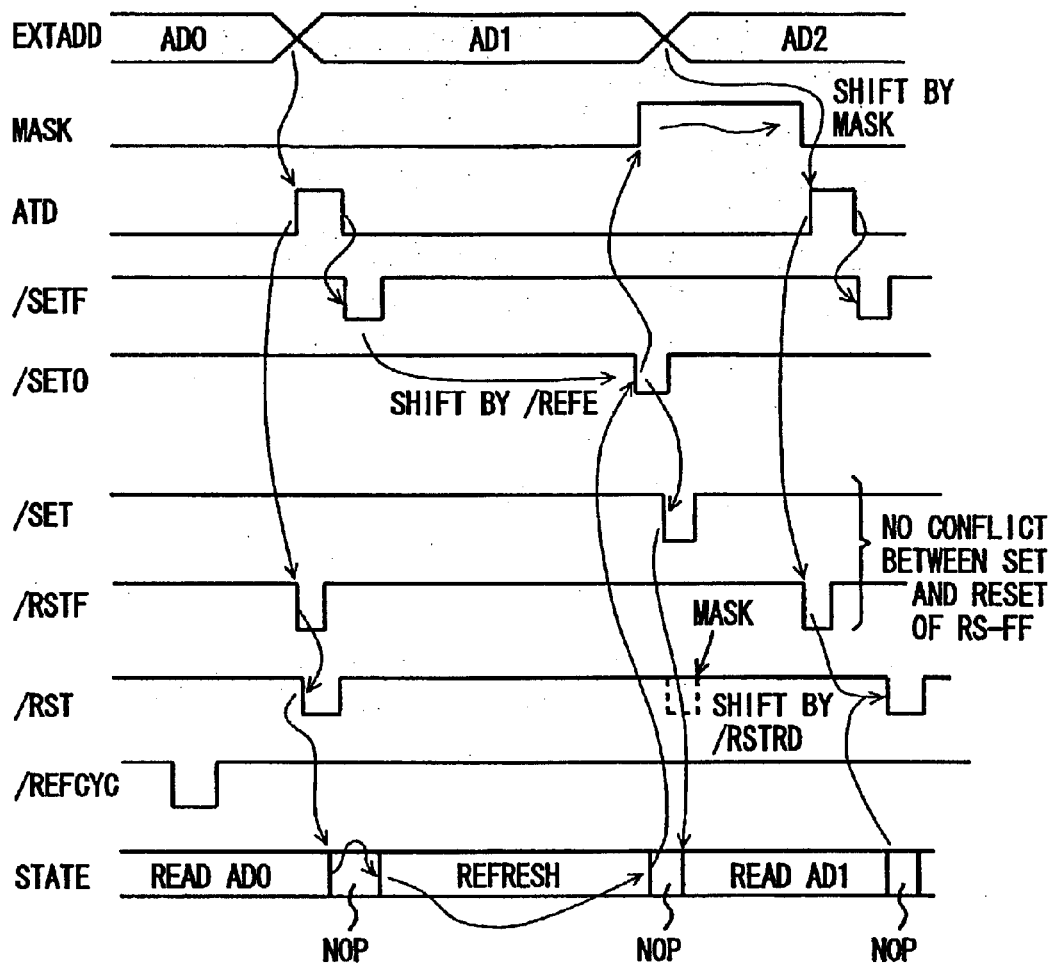
FIG. 11 is a signal waveform diagram representing operations when the main control circuit shown in FIG. 7 performs setting/resetting operations.

FIG. 11 is a signal waveform diagram representing operations of a part related to mask signal MASK of the circuit shown in FIG. 7. Referring to FIG. 11, the address mask operation of the circuit shown in FIG. 7 will be described.

A state is considered where refresh cycle signal /REFCYC is activated while a data access (data reading) to address AD0 is executed internally in accordance with external address signal EXTADD. In this case, when external address signal EXTADD changes to address AD1 next, since mask signal MASK is at the L level and transmission gate 144 is conductive, ATD circuit 146 generates address transition detection signal ATD of one shot. In response to the rising of address transition detection signal ATD, reset fast signal /RSTF from leading edge pulse generating circuit 126 is activated. When delayed restore period signal /RSTRD at the time of accessing address AD0 is made inactive, shifter 130 inactivates reset signal /RST. Accordingly, flip flop 128 is reset, and internal normal row activating signal /intRE is made inactive.

Since the refresh flag is set in accordance with refresh cycle signal /REFCYC, refresh control circuit 40 activates refresh activating signal /REFE to execute a refreshing operation. In response to the falling (trailing edge) of address transition detection signal ATD, trailing edge pulse generating circuit 124 activates set fast signal /SETF. Since refresh activating signal /REFE is in an active state, shifter 125 shifts the timing of activating set control signal /SET0 until completion of the refreshing operation. On completion of the refreshing operation, set control signal /SET0 from shifter 125 is activated. In response to activation of set control signal /SET0, leading edge pulse generating circuit 140 generates a one-shot pulse signal and mask signal MASK accordingly is set to the H level for a predetermined period. For the H-level period of mask signal MASK, transmission gate 144 is in a nonconductive state. Therefore, even if external address EXTADD changes from AD1 to AD2 while mask signal MASK is at the H level, no address transition detection signal ATD is generated. According to set control signal /SET0, set signal /SET is activated, flip flop 128 is set, and a data access to address AD1 is executed. Therefore, it can be prevented that reset signal /RST is activated when internal normal row activating signal /intRE is active and the setting operation and the resetting operation collide at set/reset flip flop 128. Thus, the internal operation can be executed accurately.

When mask signal MASK falls to the L level, transmission gate 144 is made conductive, the next address is supplied to ATD circuit 146, and ATD circuit 146 activates address transition detection signal ATD. In response to the leading edge (rising) of address transition detection signal ATD, leading edge pulse generating circuit 126 activates reset fast signal /RSTF. When the data access is completed and delayed restore period signal /RSTRD is made inactive, shifter 130 inactivates reset signal /RST in accordance with reset fast signal /RSTF to make internal normal row activating signal /intRE inactive. When internal normal row activating signal /intRE is made inactive, shifter 125 activates set control signal /SET0 again. After delay time of delay circuit 127, set signal /SET is activated again, and internal normal row activating signal /intRE is made active. Accordingly, a data access to address AD2 is executed.

As shown in FIG. 11, therefore, when address transition detection signal ATD is activated in response to a transition from address AD1 to address AD2 on completion of refresh, there is the possibility that both set signal /SET and reset signal /RST may be activated (shown with broken lines in FIG. 11). However, by using mask signal MASK, reset signal /RST can be prevented from being activated while set signal /SET is activated. Thus, set/reset flip flop 128 can be accurately set/reset.

Figure 12:
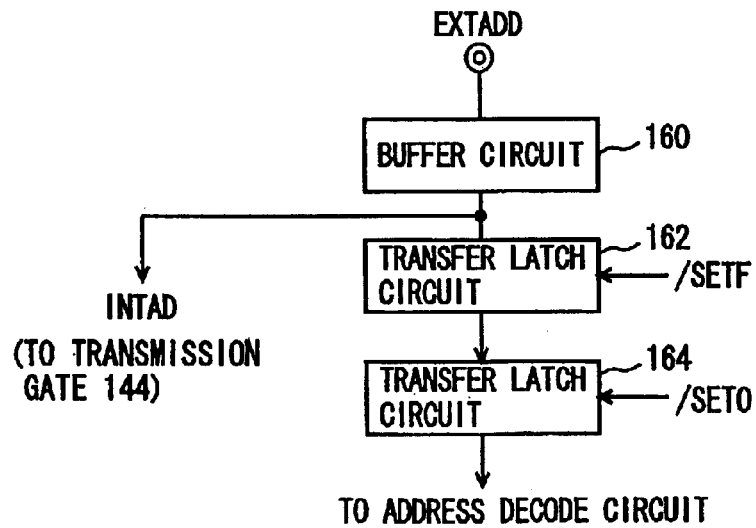
FIG. 12 is a diagram showing an example of the configuration of an address input part in the first embodiment of the present invention.

FIG. 12 is a diagram schematically showing the configuration of an address signal input part of the semiconductor memory device according to the first embodiment of the present invention. In FIG. 12, the address signal input part includes: a buffer circuit 160 for buffering external address signal EXTADD and generating internal address signal INTAD; a transfer latch circuit 162 for taking in and latching internal address signal INTAD from buffer circuit 160 in response to activation of set fast signal /SETF; and a transfer latch circuit 164 for taking in and latching an address signal outputted from transfer latch circuit 162 in response to activation of set control signal SET0.

Internal address signal INTAD from buffer circuit 160 is applied to transmission gate 144 shown in FIG. 7. The address signal from transfer latch circuit 164 is supplied to an address decode circuit or address latch circuit for row and column address. Each of transfer latch circuits 162 and 164 is constructed by, for example, a transmission gate and an inverter latch (refer to FIG. 8).

Figure 13:
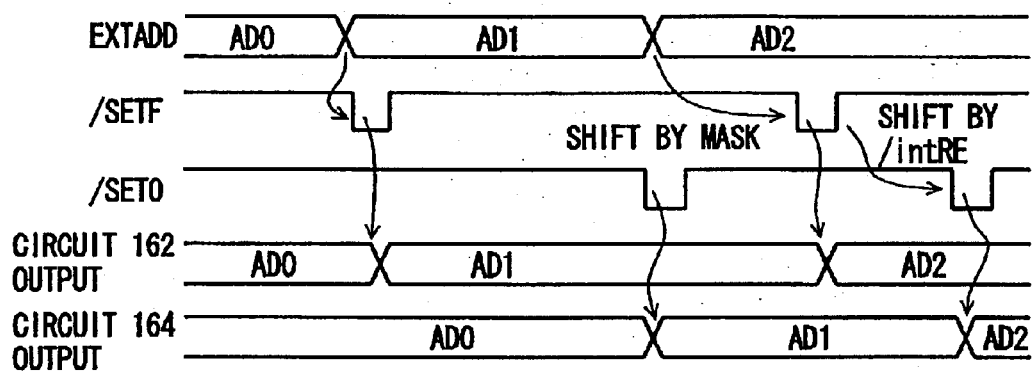
FIG. 13 is a timing chart representing an operation of the address input part shown in FIG. 12.

FIG. 13 is a timing chart representing an operation of the address signal input part shown in FIG. 12. Referring to FIG. 13, the operation of the address signal input part shown in FIG. 12 will now be briefly described.

When external address signal EXTADD changes from address AD0 to address AD1, set fast signal /SETF is activated. Accordingly, transfer latch circuit 162 takes in and latches an address signal from buffer circuit 160. Therefore, the address signal outputted from transfer latch circuit 162 indicates address AD1.

When a refresh is executed internally or a data access is performed to a memory cell internally, set control signal /SET0 is not activated until the memory cell selecting operation is completed (by shifter 125). When the memory cell selecting operation is completed internally, set control signal /SET0 is activated, and transfer latch circuit 164 takes in an address signal outputted from transfer latch circuit 162. Therefore, the address from transfer latch circuit 164 turns address AD1. At this time, the mask signal is generated in response to activation of set control signal /SET0. In response to inactivation of the mask signal, address transition detection signal ATD is activated, and set fast signal /SETF is activated.

In response to activation of set fast signal /SETF, transfer latch circuit 162 takes in and latches an address signal from buffer circuit 150. Therefore, in this state, the address signal outputted from transfer latch circuit 162 is address AD2. When the data access to address AD1 is completed, set control signal /SET0 is activated, transfer latch circuit 164 operates to supply address AD2 to an address decoding circuit.

Also in the case of delaying the next operation start when the memory cell selecting operation is executed internally, an address signal corresponding to the next internal operation is supplied to the decode circuit with accuracy, a memory cell is selected, and a data access can be performed.

Figure 14:
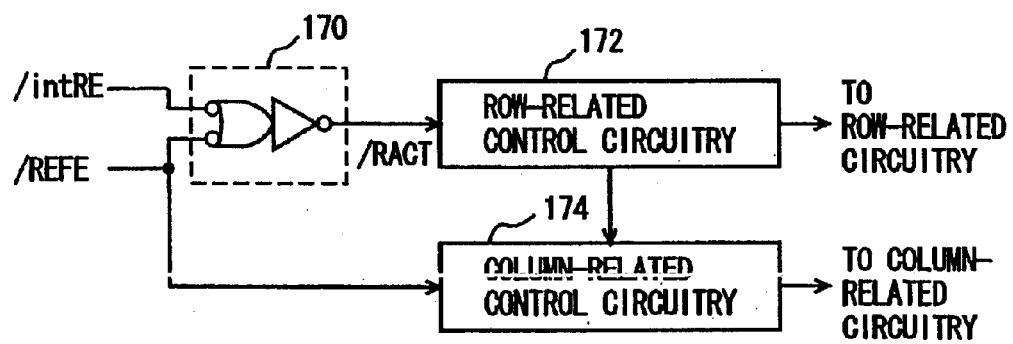
FIG. 14 is a diagram schematically showing the configuration of row and column related control units of the main control circuit according to the first embodiment of the present invention.

FIG. 14 is a diagram schematically showing the configuration of a control signal generating unit included in main control circuit 20 shown in FIG. 1. In FIG. 14, main control circuit 20 includes: a composite AND gate 170 receiving internal normal row activating signal /intRE and refresh activating signal /REFE; a row-related control circuit 172 for generating control signals to row-related circuits such as a row decoder and a sense amplifier in accordance with an output signal /RACT of composite AND gate 170; and a column-related control circuit 174 selectively activated under control of row-related control circuit 172 to control operations of column-related circuits such as a column decoder, an internal data writing/reading circuit, and a data input/output circuit.

A column selecting operation of column-related control circuit 174 is inhibited when refresh activating signal /REFE is active.

Row-related control circuit 172 controls operations related to memory cell row selection in a data access operation, and activation of a row decoder, driving of a word line to a selected state, and activation of the sense amplifier are performed in a predetermined sequence. On completion of the sensing operation by the sense amplifier, column-related control circuit 174 is activated to execute the column selecting operation. Activation of column-related control circuit 174 is determined by column activating signal /CDE. Writing and reading of data is determined by write enable signal /WE and output enable signal /OE applied externally.

As shown in FIG. 14, when internal normal row activating signal /intRE or refresh activating signal /REFE are activated, array activating signal /RACT is activated, and a row selecting operation is internally executed. Internal normal row activating signal /intRE and refresh activating signal /REFE are prevented from being simultaneously activated, and one of the refreshing operation and data accessing operation is executed.

Preferably, refresh activating signal /REFE and internal normal row activating signal /intRE are made inactive after the internal state returns to the initial state (precharge state). With such sequence, the next operation can be started after the internal state recovers to the initial state. Therefore, the next operation is allowed reliably to be started after termination of a so-called RAS precharge period. It can be reliably prevented that the recovering to the initial state is interrupted and data is destroyed.

Modification

Figure 15:
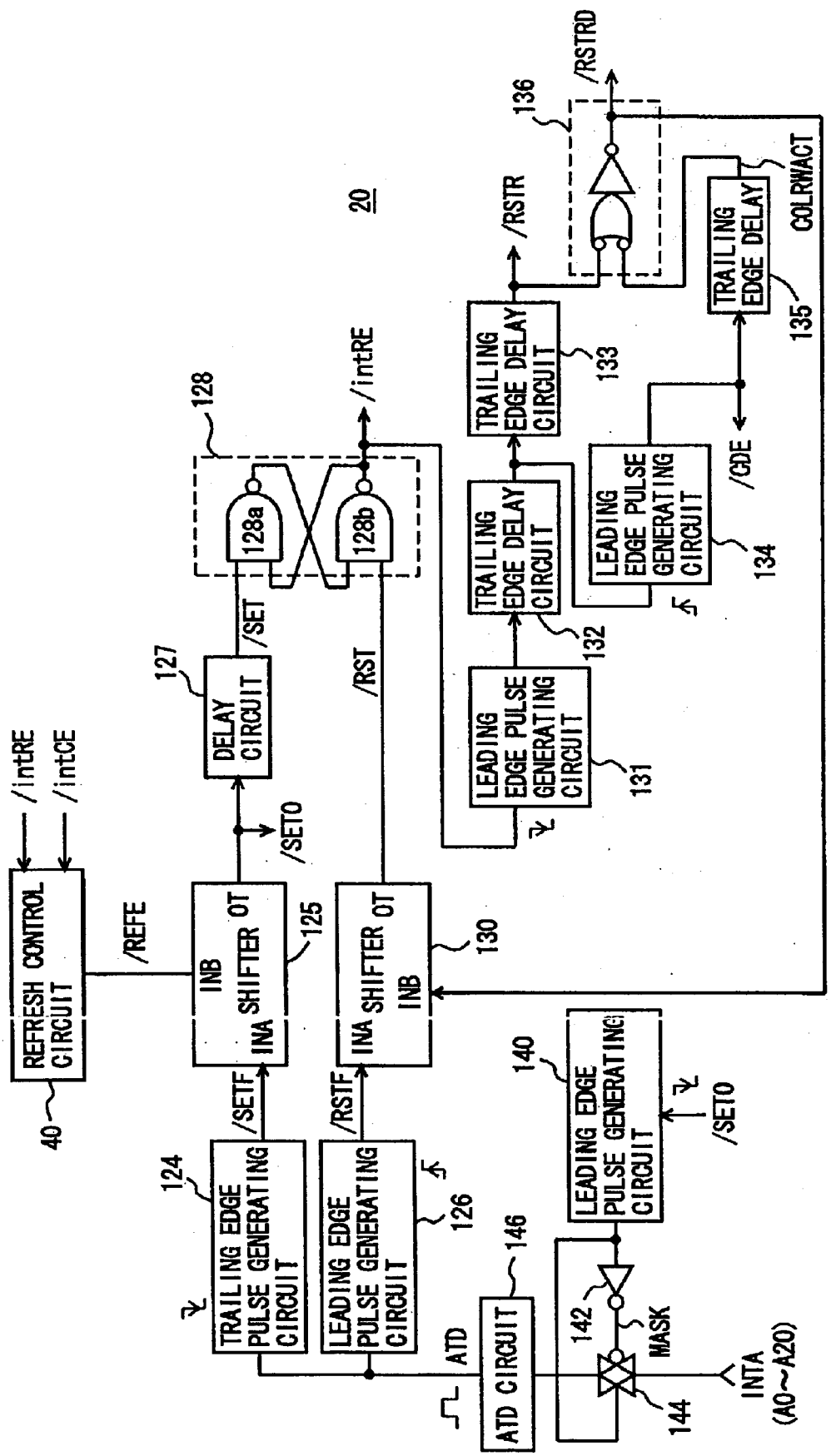
FIG. 15 is a diagram schematically showing the configuration of a main control circuit of a modification of the first embodiment of the present invention.

FIG. 15 is a diagram schematically showing the configuration of a modification of the first embodiment of the present invention. In FIG. 15, refresh activating signal /REFE from refresh control circuit 40 is supplied to input node INB of shifter 125 for shifting set fast signal /SETF. The other configuration of the control circuit shown in FIG. 15 is the same as that of the main control circuit shown in FIG. 1. Corresponding parts are denoted by the same reference numerals and detailed description thereof will not be repeated.

In the configuration of main control circuit 20 shown in FIG. 15, when the refresh operation is internally executed, even if an address signal changes, the data access for the address signal is delayed until the refreshing is completed. In this case, upon completion of the refresh, set control signal /SET0 from shifter 125 is activated. At this time, if address transition detection signal ATD is generated, setting and resetting operations of set/reset flip flop 128 are superimposed, so that the internal operation cannot be set with accuracy.

However, when set control signal /SET0 is generated and set/reset flip flop 128 is set, mask signal MASK is activated, so that reset signal /RST can be activated only after completion of the memory cell selecting operation.

Therefore, also in the configuration of main control circuit 20 shown in FIG. 15, the setting operation and the resetting operation of flip flop 128 can be prevented from being superimposed, for example, upon completion of the refreshing operation.

As described above, according to the first embodiment of the present invention, when internal normal row activating signal /intRE is active, generation of the address transition detection signal is masked, and operation instructions to activate and inactivate the internal normal row activating signal can be prevented from being superimposed. Thus, the internal operation can be started reliably.

Second Embodiment

Figure 16:
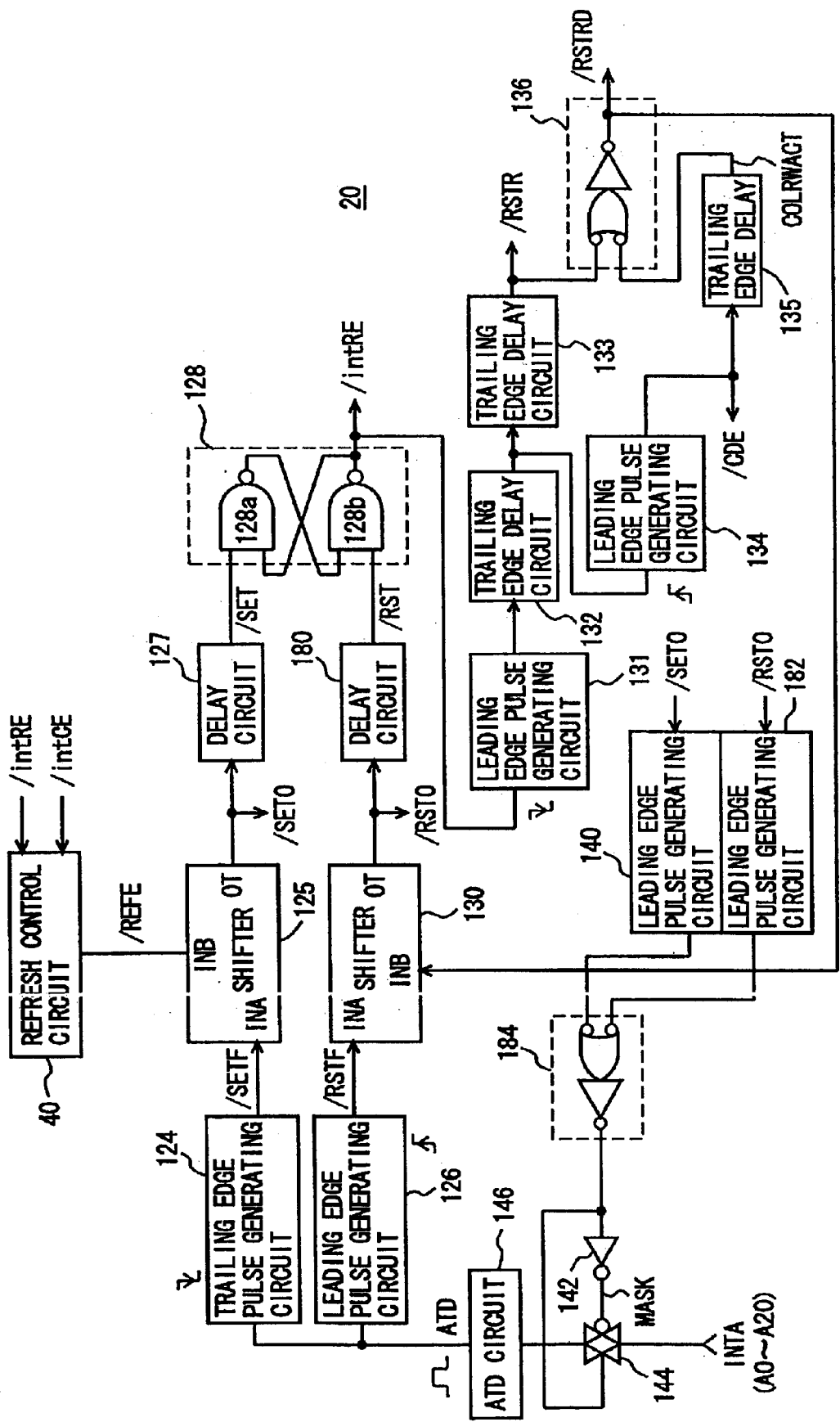
FIG. 16 is a diagram schematically showing the configuration of a main control circuit according to a second embodiment of the present invention.

FIG. 16 is a diagram schematically showing the configuration of a main control circuit according to a second embodiment of the present invention. The configuration of main control circuit 20 shown in FIG. 16 is different from that of the main control circuit shown in FIG. 15 in the following points.

Specifically, a delay circuit 180 is disposed between shifter 130 and set/reset flip flop 128. In addition, there are provided a leading edge pulse generating circuit 182 for generating a one-shot pulse signal in response to the leading edge (falling) of reset control signal /RST0 outputted from shifter 130, and a composite AND gate 184 receiving output signals of leading edge pulse generating circuits 140 and 182. An output signal of composite AND gate 184 is supplied to inverter 142 for generating mask signal MASK. The other configuration of the main control circuit shown in FIG. 16 is the same as that of the main control circuit shown in FIG. 15. Corresponding parts are denoted by the same reference numerals and the detailed description thereof will not be repeated.

In the configuration of the main control circuit shown in FIG. 16, when set/reset flip flop 128 is set and reset, leading edge pulse generating circuits 140 and 182 generate one-shot pulse signals, and mask signal MASK is generated. Therefore, on completion and start of the internal operation, the setting operation and the resetting operation of the set/reset flip flop can be prevented from being superimposed with each other.

Figure 17:
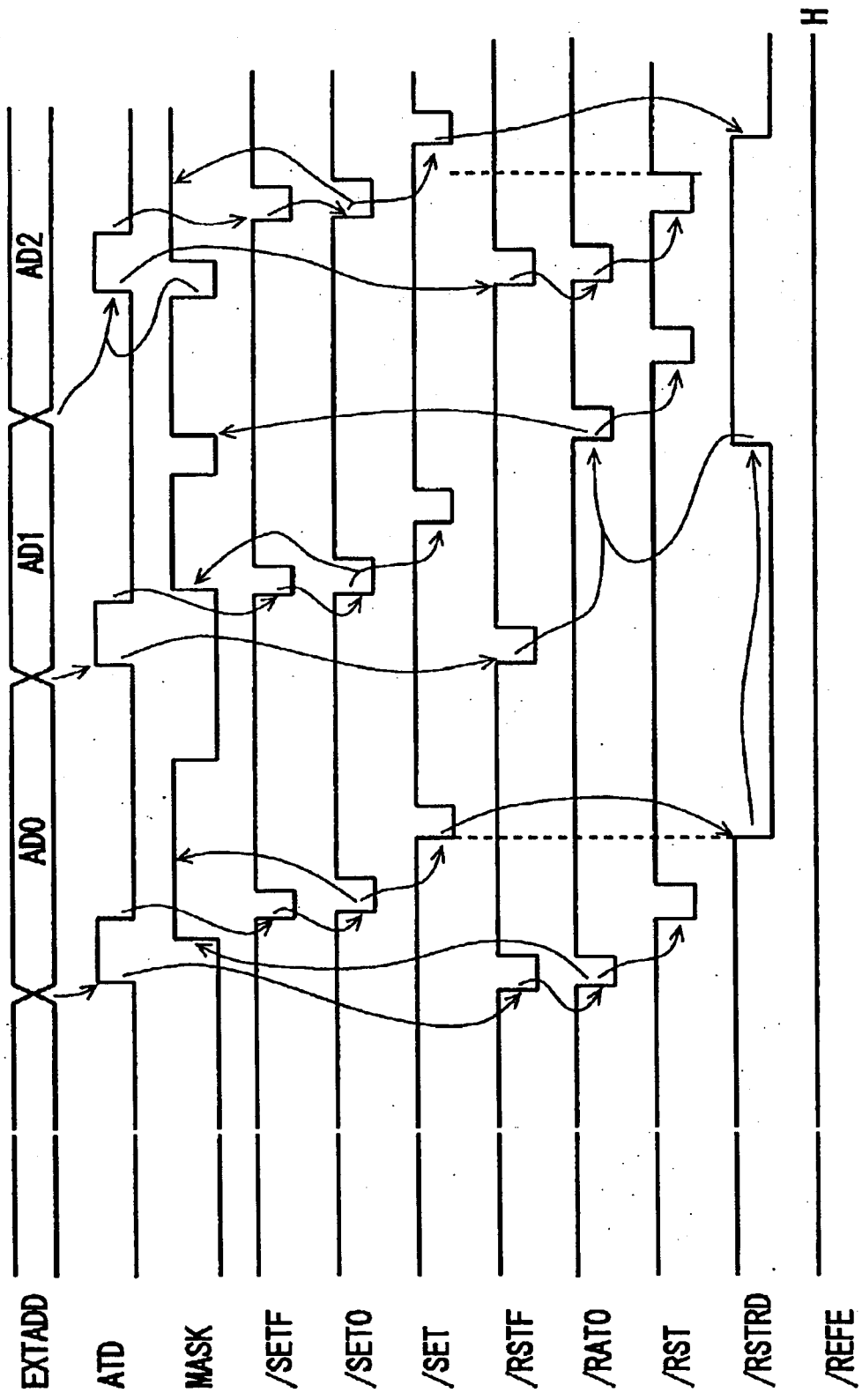
FIG. 17 is a signal waveform diagram representing an operation of the main control circuit shown in FIG. 16.

FIG. 17 is a signal waveform diagram representing the operations when main control circuit 20 shown in FIG. 16 is set/reset. Referring to FIG. 17, the operations when the internal operation of main control circuit 20 shown in FIG. 16 is set/reset will be described in the following.

A state is considered where delayed restore period signal /RSTRD is at the H level and the internal state is in a precharged state will be considered. Refresh activating signal /REFE is at the H level.

When external address signal EXTADD changes to address AD0, since mask signal MASK is at the L level, transmission gate 144 is conductive, and address transition detection signal ATD is generated by ATD circuit 146. In response to the rising of address transition detection signal ATD, leading edge pulse generating circuit 126 activates reset fast signal /RSTF. Accordingly, since delayed restore period signal /RSTRD is response to activation of reset control signal /RST0, leading edge pulse generating circuit 182 generates a one-shot pulse signal and, accordingly, mask signal MASK is activated.

When address transition detection signal ATD falls, set fast signal /SETF from trailing edge pulse generating circuit 124 is activated. Since refresh activating signal REFE is in the inactive state, set control signal /SET0 from shifter 125 is accordingly activated. In response to activation of set control signal /SET0, leading edge pulse activation circuit 140 is activated, and the period of the H level of mask signal MASK is expanded. The active period of mask signal MASK is set to be substantially the same as or shorter than the pulse width of address transition detection signal ATD.

When set control signal /SET0 is activated, after elapse of a predetermined time, set signal /SET is activated by an output signal of delay circuit 127, delayed restore period signal /RSTRD is activated, and an internal memory selecting operation is started.

Reset signal /RST and set signal /SET have a time difference corresponding to the pulse width of address transition detection signal ATD, so that set/reset flip flop 128 is set reliably.

A state is considered where address signal EXTADD transits from address AD0 to address AD1 during the period in which delayed restore period signal /RSTRD is at the L level. Mask signal MASK is at the L level, transmission gate 144 is in a conductive state, address transition detection signal ATD is generated according to an address transition and, accordingly, reset fast signal /RSTF is activated by leading edge pulse generating circuit 126. Since delayed restore period signal /RSTRD is at the L level, shifter 130 delays the timing of activating reset control signal /RST0.

In response to the falling of address transition detection signal ATD, set fast signal /SETF from trailing edge pulse generating circuit 124 is activated, set control signal /SET0 is accordingly activated, and mask signal MASK is set to the H level. In response to the activation of set control signal /SET0, according to the output signal of delay circuit 127, set signal /SET is activated. At this time, flip flop 128 is in a set state, and the internal state does not change.

In response to activation of set control signal /SET0, mask signal MASK is set to the H level again.

When delayed restore period signal /RSTRD rises to the H level after set signal /SET is activated, shifter 130 activates reset control signal /RST0. In response to activation of reset control signal /RST0, leading edge pulse activation circuit 182 generates a one-shot pulse signal and sets mask signal MASK to the H level.

A state will now considered where external address signal EXTADD transitions from address AD1 to address AD2 when delayed restore period signal /RSTRD rises to the H level and reset signal /RST is activated. At this time, since mask signal MASK is at the H level and transmission gate 144 is in a non-conductive state, generation of address transition detection signal ATD is blocked. After set/reset flip flop 128 is reset by reset signal /RST, mask signal MASK falls to the L level. Accordingly, transmission gate 144 is made conductive, address signal AD2 is supplied to ATD circuit 146, and address transition detection signal ATD is activated.

In response to activation of address transition detection signal ATD, reset fast signal /RSTF is generated by leading edge pulse generating circuit 126, and shifter 130 activates external reset signal /RST0. Accordingly, mask signal MASK is set again to the H level to mask transfer of the address signal. After elapse of predetermined time, reset signal /RST falls to the L level, and set-reset flip flop 128 is reset. In response to the falling of address transition detection signal ATD, set fast signal /SETF from trailing edge pulse generating circuit 124 falls to the L level. Accordingly, set control signal /SET0 from shifter 125 is activated and mask signal MASK is generated again by leading edge pulse generating circuit 140.

After elapse of a predetermined period since set control signal /SET0 is activated, set/reset flip flop 128 is set by an output signal of delay circuit 127, and delayed restore period signal /RSTRD is activated. By this time of setting, reset signal /RST has already recovered to the H level and set/reset flip flop 128 is set reliably.

Therefore, when the recovery operation is performed internally, mask signal MASK is activated, so that address transition detection signal ATD can be prevented from being generated during the recovery period, and the setting operation and the resetting operation of set/reset flip flop 128 can be prevented from conflicting with each other.

In the operation waveform shown in FIG. 17, after a data access to address AD0 is performed, a data access to address AD2 may be performed. Specifically, by latching an external address signal in accordance with internal normal row activating signal /intRE, a data access to address AD1 of a short cycle can be ignored. Alternately, in a manner similar to the first embodiment, external address signals may be sequentially latched and transferred by signals /SETF and /SET0 to sequentially access addresses AD0, AD1 and AD2.

Modification

Figure 18:
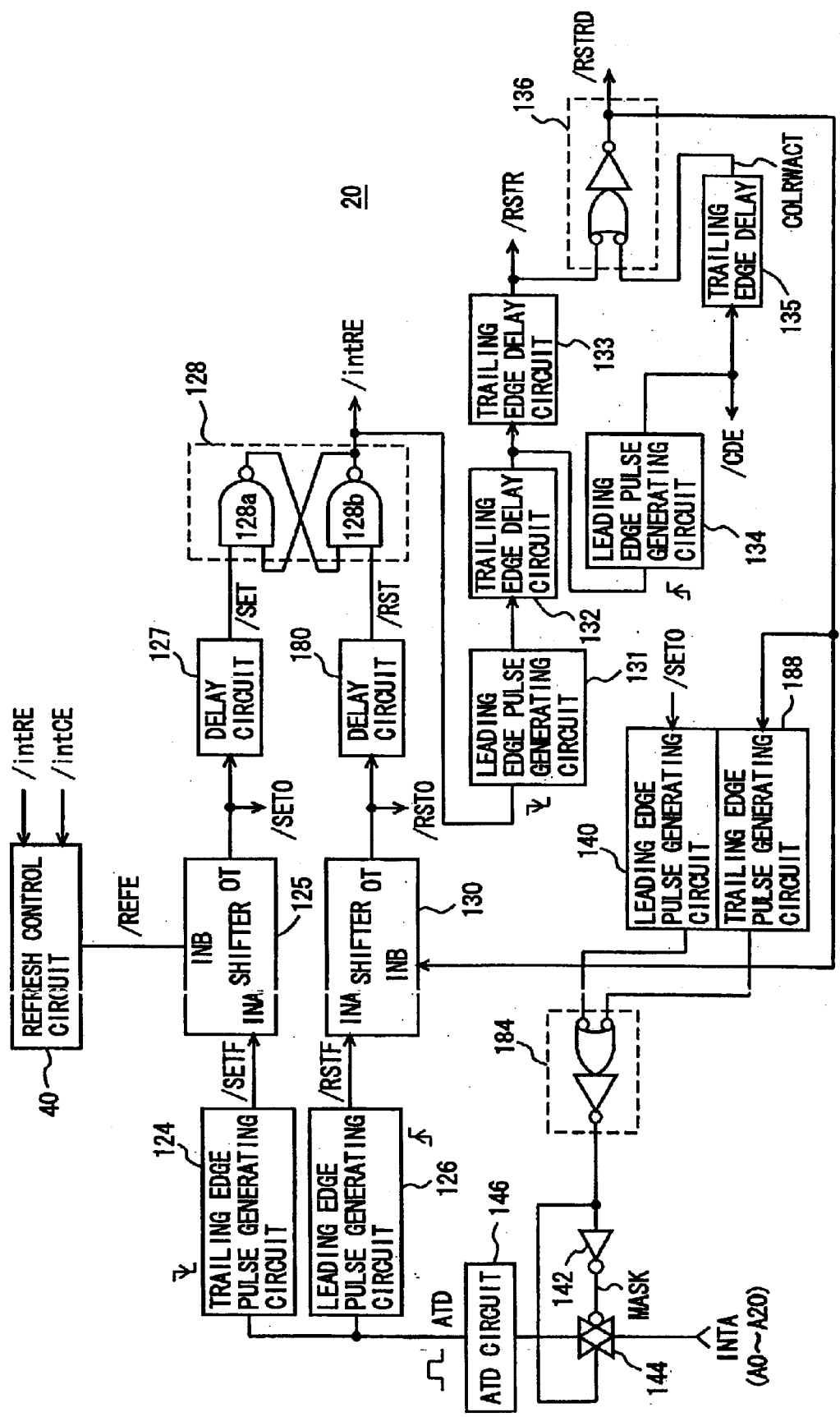
FIG. 18 is a diagram schematically showing the configuration of a main control circuit of a modification of the second embodiment of the present invention.

FIG. 18 is a diagram schematically showing the configuration of a modification of a semiconductor memory device according to the second embodiment of the present invention. In the configuration of main control circuit 20 shown in FIG. 18, to generate mask signal MASK, delayed restore period signal /RSTRD is used in place of reset control signal /RST0. That is, delayed restore period signal /RSTRD is applied to a trailing edge pulse generating circuit 188. Output pulse signals of leading edge pulse generating circuit 140 and trailing edge pulse generating circuit 188 are supplied to composite AND gate 184.

The other configuration shown in FIG. 18 is the same as that shown in FIG. 16. Corresponding parts are denoted by the same reference numerals and the detailed description thereof will not be repeated.

Figure 19:
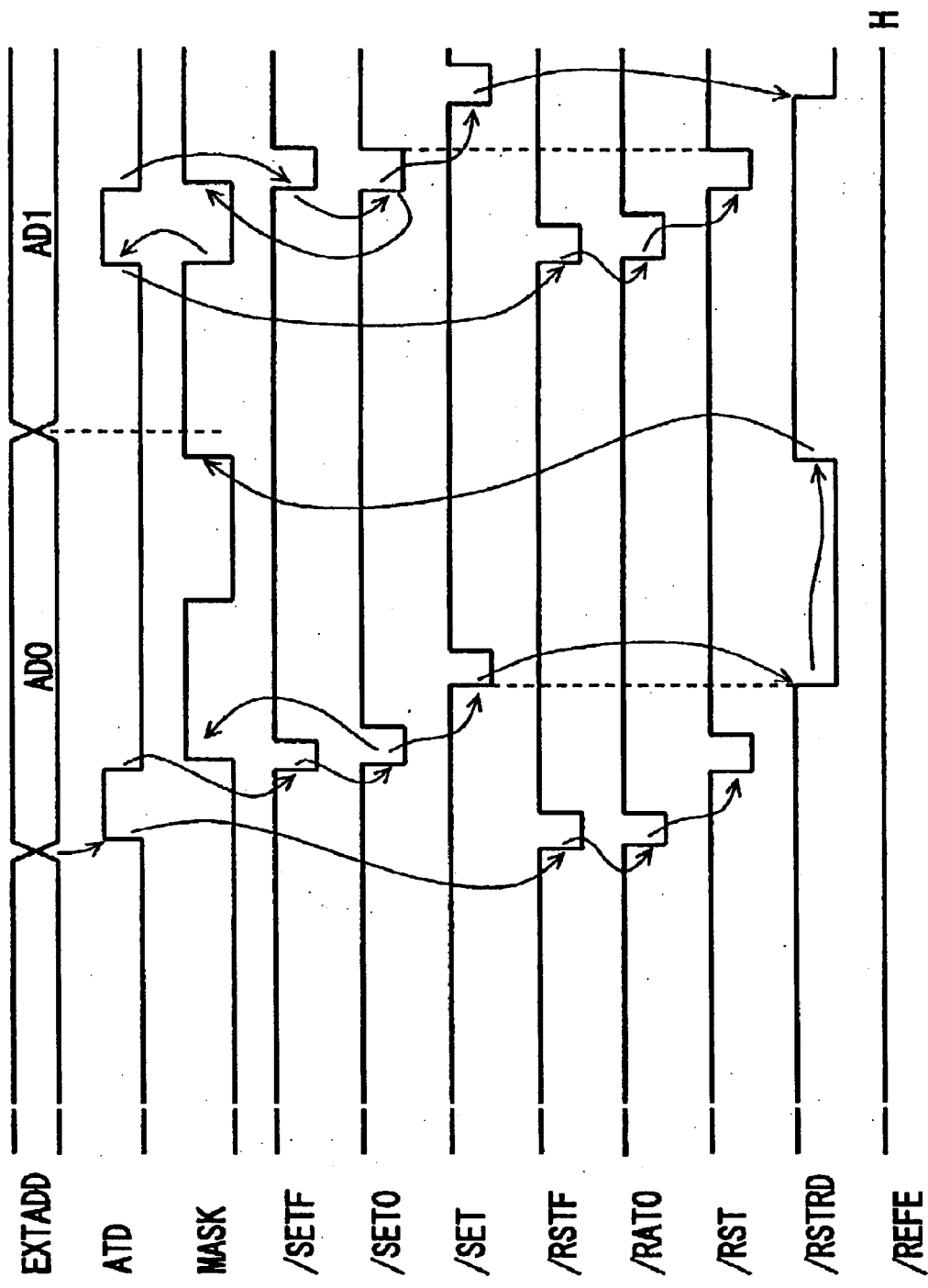
FIG. 19 is a signal waveform diagram representing an operation of a main control circuit shown in FIG. 18.

FIG. 19 is a signal waveform diagram representing operations of main control circuit 20 shown in FIG. 18. Referring to FIG. 19, the operations when main control circuit 20 shown in FIG. 18 is set/reset will be described.

An initial state is considered where delayed restore period signal /RSTRD is at the H level and mask signal MASK is at the L level. Refresh activating signal /REFE is at the H level. When external address signal EXTADD changes to address AD0, since transmission gate 144 is in a conductive state, address transition detection signal ATD is generated from ATD circuit 146. In response to the leading edge (rising) of address transition detection signal ATD, reset fast signal /RSTF from leading edge pulse generating circuit 126 is activated and, accordingly, reset control signal /RST0 from shifter 130 is activated. After elapse of predetermined time, reset signal /RST is activated by delay circuit 180.

On the other hand, in response to the falling of address transition detection signal ATD, set fast signal /SETF is activated by trailing edge pulse generating circuit 124 and, subsequently, set control signal /SET0 is activated. In response to activation of set control signal /SET0, mask signal MASK is set at the H level for a predetermined period, and transmission gate 144 is made non-conductive. After elapse of a predetermined period, set signal /SET is activated and delayed restore period signal /RSTRD turns L level. Set signal /SET and reset signal /RST have a time difference corresponding to the pulse width of address transition detection signal ATD, and set/reset flip flop 128 can be set reliably.

When the memory cell selecting operation (data accessing operation) is internally completed, delayed restore period signal /RSTRD rises to the H level. In response to the rising of restore delay period signal /RSTRD, trailing edge pulse generating circuit 188 generates a one-shot pulse signal and, accordingly, mask signal MASK attains to the H level. Even if external address signal EXTADD transitions from address AD0 to address AD1 while mask signal MASK is at the H level, since transmission gate 144 is in a nonconductive state, address transition detection signal ATD is not generated.

After delayed restore period signal /RSTRD rises to the H level and the internal state reliably recovers to the initial state, mask signal MASK falls to the L level and transmission gate 144 is made conductive. In response to conduction of transmission gate 144, ATD circuit 146 generates address transition detection signal ATD. In response to line rising of address transition detection signal ATD, reset fast signal /RSTF from leading edge pulse generating circuit 126 is activated and, subsequently, reset control signal /RST0 from shifter 130 is activated. After elapse of predetermined time, reset signal /RST is activated, set/reset flip flop 128 is reset, and internal normal row activating signal /intRE is made inactive.

On the other hand, in response to the trailing edge (falling) of address transition detection signal ATD, set fast signal /SETF from trailing edge pulse generating circuit 124 is activated and, subsequently, set control signal /SET0 from shifter 125 is activated. In response to activation of set control signal /SET0, a one-shot pulse signal is generated from leading edge pulse generating circuit 140 and, accordingly, mask signal MASK becomes the H level for a predetermined period. Then, set signal /SET is driven to an active state, set/reset flip flop 128 is set, internal normal row activating signal /intRE turns L level, and a memory cell selecting operation is executed. At this time, delayed restore period signal /RSTRD falls to the L level.

In the setting operation, since mask signal MASK is at the H level, address transition detection signal ATD is not generated, and reset signal /RST is reliably held in an inactive state.

Therefore, by generating mask signal MASK through use of delayed restore period signal /RSTRD indicative of recovery to the precharge state on the inside of the memory device, address transition detection signal ATD can be prevented from being generated during the internal recovering period. When the transition from address AD0 to address AD1 occurs during the period in which delayed restore period signal /RSTRD is at the L level, after delayed restore period signal /RSTRD is driven to the inactive state, reset signal /RST is activated. At this time, mask signal MASK is at the H level, address transition detection signal ATD is not generated, and conflict between the setting operation and the resetting operation of the set/reset flip flop can be avoided.

In the second embodiment as well, in a manner similar to the configuration shown in FIG. 7, an output signal of the composite AND gate receiving refresh activating signal /REFE and internal normal row activating signal /intRE may be supplied to input node INB of shifter 125 for generating set control signal /SET0.

As described above, according to the second embodiment of the present invention, in resetting the internal state as well, generation of an address transition detection signal is masked. Thus, the address transition detection signal can be prevented from being generated during the period in which the internal state recovers to the initial state, and the internal normal row activating signal can be set/reset accurately.

Third Embodiment

Figure 20:
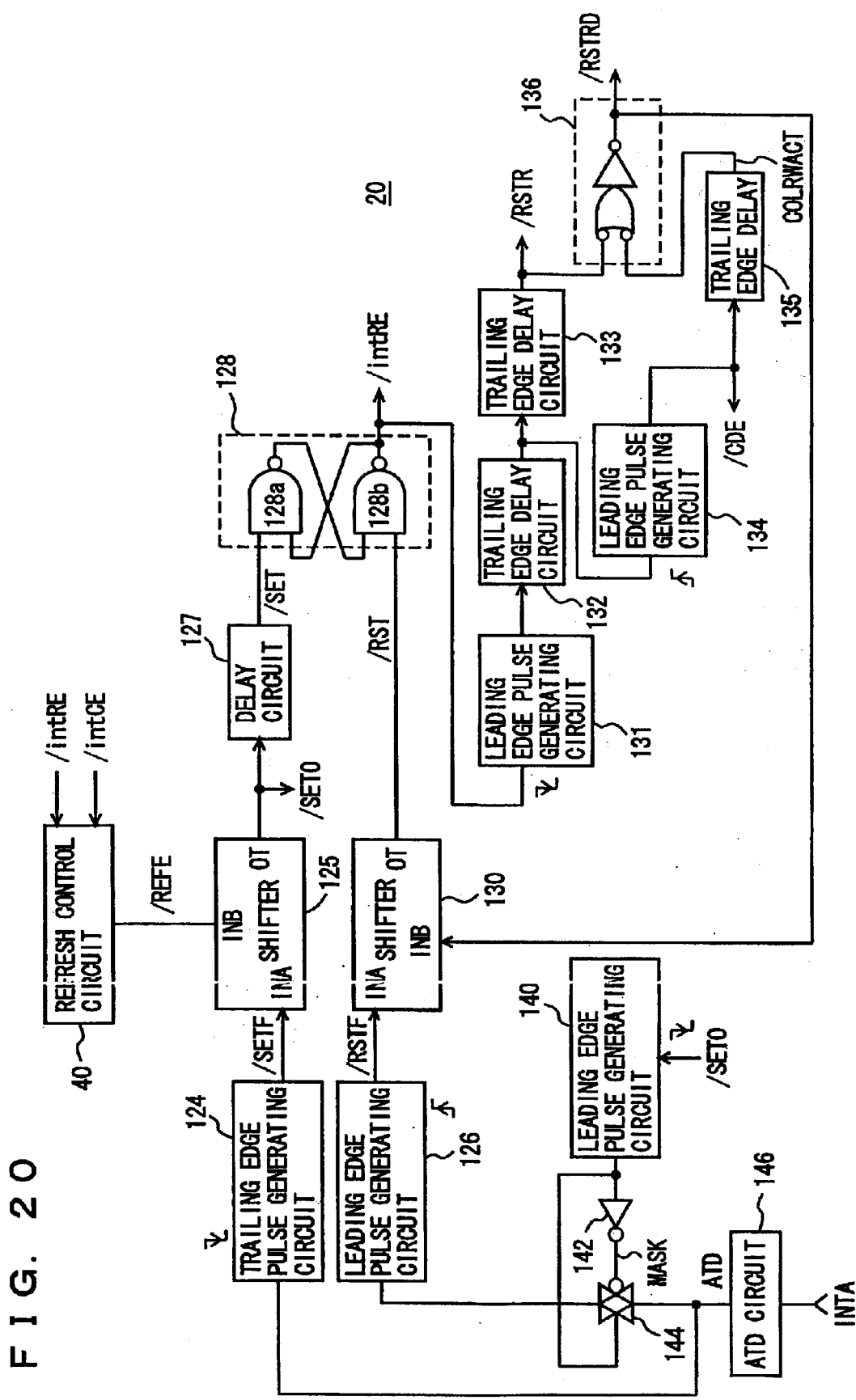
FIG. 20 is a diagram schematically showing the configuration of a main control circuit according to a third embodiment of the present invention.

FIG. 20 is a diagram schematically showing the configuration of main control circuit 20 according to a third embodiment of the present invention. In the configuration of main control circuit 20 shown in FIG. 20, internal address signal INTA is always supplied to ATD circuit 146. Address transition detection signal ATD from ATD circuit 146 is supplied to trailing edge pulse generation circuit 124. On the other hand, address transition detection signal ATD is supplied to leading edge pulse generating circuit 126 via transmission gate 144. Mask signal MASK for controlling conduction and non-conduction of transmission gate 144 is generated by leading edge pulse generating circuit 140 receiving set control signal /SET0 and inverter 142 receiving an output signal of leading edge pulse generating circuit 140.

The other configuration of the main control circuit shown in FIG. 20 is the same as that of the main control circuit shown in FIG. 15. Corresponding parts are designated by the same reference numerals and the detailed description thereof will not be repeated.

In the configuration shown in FIG. 20, ATD circuit 146 generates address transition detection signal ATD of which active period is equal to or longer than the restore period. The restore period will be described in detail later.

Figure 21:
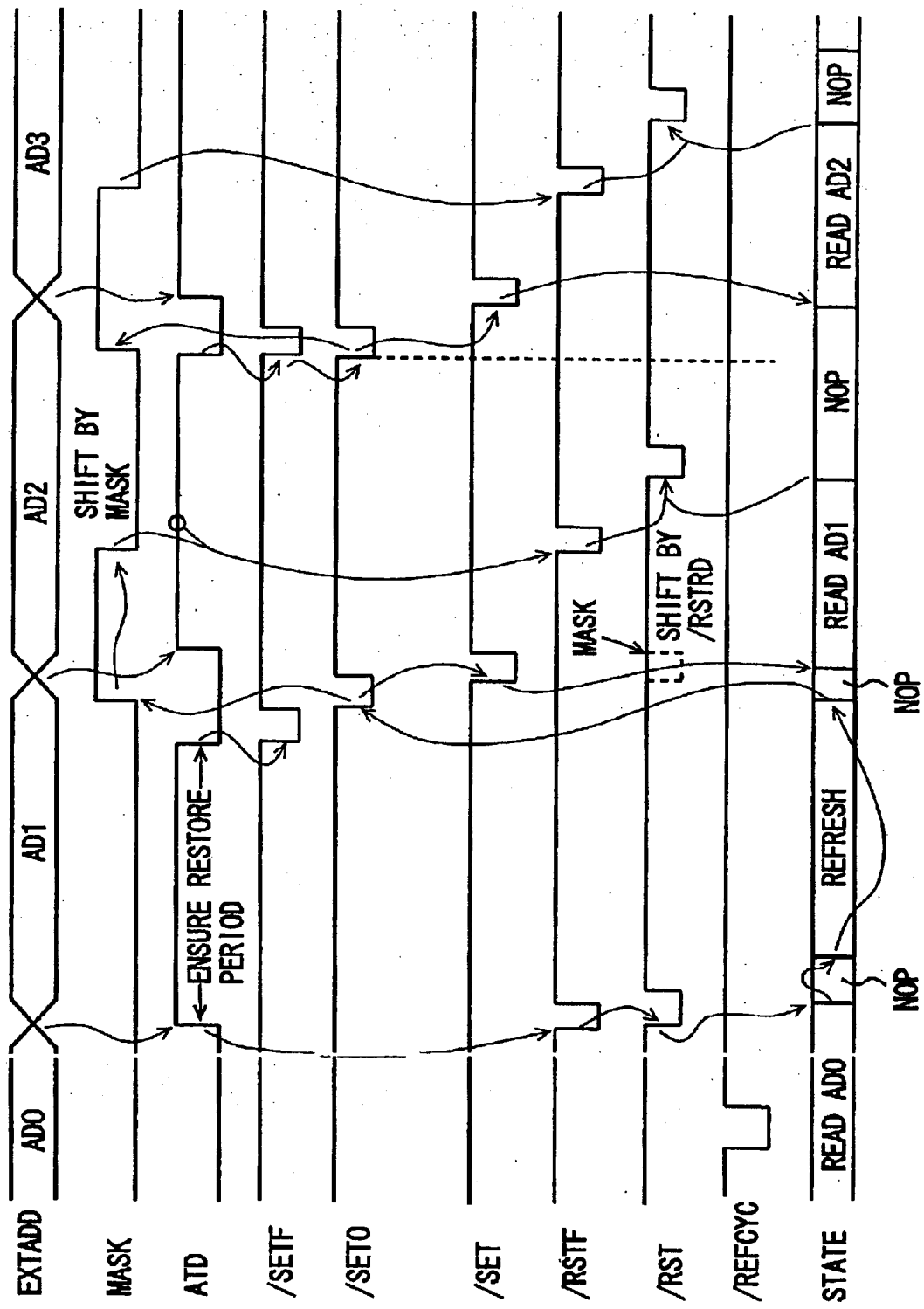
FIG. 21 is a signal waveform diagram representing an operation of a main control circuit shown in FIG. 20.

FIG. 21 is a signal waveform diagram representing an operation of the main control circuit shown in FIG. 20. Referring to FIG. 21, the operation of the main control circuit shown in FIG. 20 will now be described in the following.

When external address signal EXTADD transitions from address AD0 to address AD1, address transition detection signal ATD is generated from ATD circuit 146. At this time, mask signal MASK is at the L level, so that transmission gate 144 is in a conductive state. Therefore, in response to the leading edge (rising) of address transition detection signal ATD, leading edge pulse generating circuit 126 activates reset fast signal /RSTF. Since restore signal /RSTRD is at the H level, shifter 130 activates reset signal RST in accordance with reset fast signal /RSTF to reset set/reset flip flop 128.

If refresh cycle signal /REFCYC is activated in the preceding cycle, in the subsequent cycle, the refresh operation is executed. When address transition detection signal ATD falls to the L level during the period of the refreshing operation, set fast signal /SETF from trailing edge pulse generating circuit 124 is activated.

When the refreshing operation is completed and refresh activating signal /REFE is made inactive, set signal /SET0 from shifter 125 is activated and, accordingly, mask signal MASK is generated by leading edge pulse generating circuit 140 and inverter 142. Mask signal MASK merely inhibits transfer of address transition detection signal ATD from ATD circuit 146 to leading edge pulse generating circuit 126. Therefore, when external address signal EXTADD transitions from address AD1 to address AD2, address transition detection signal ATD rises to the H level again. Although address transition detection signal ATD rises to the H level, mask signal MASK is at the H level, so that transfer of address transition detection signal ATD to pulse generating circuit 126 is masked. Therefore, the data reading operation on address AD1 is subsequently executed.

When mask signal MASK falls to the L level, address transition detection signal ATD is transferred to leading edge pulse generating circuit 126 and reset fast signal /RSTF is activated. On completion of the data access operation to address AD1, reset signal /RST is made active, and the set/reset flip flop is reset.

Subsequently, when address transition detection signal ATD falls to the L level, set fast signal /SETF and set control signal /SET0 are activated again (in the case where a data access to address AD1 is completed). Therefore, when set signal /SET is activated again, an operation of accessing address AD2 is started. Mask signal MASK falls during a data access to address AD2, and reset fast signal /RSTF is activated. Therefore, on completion of a data access to address AD2, reset signal /RST is made active.

As shown in FIG. 21, when address transition detection signal ATD is masked, generation of the reset signal is masked, and the timing of generating reset signal /RST is shifted. Therefore, in each access cycle, the data access operation can be started in response to the falling of address transition detection signal ATD. In this case, for set signal /SET, address transition detection signal ATD is not masked. After elapse of a period of a pulse width of address transition detection signal ATD since the time point of a transition in the address signal, set control signal /SET0 is activated and, subsequently, set signal /SET is activated. Therefore, as compared with the case where address transition detection signal ATD is masked to mask both the resetting operation and the setting operation, the setting operation can be performed promptly with a period of performing the resetting operation eliminated and the internal operation start timing can be advanced.

By setting the pulse width of address transition detection signal ATD to the restore period or longer, the following advantages are provided. Specifically, when mask signal MASK falls to the L level, reset fast signal RSTF is activated according to address transition detection signal ATD. By this time point, the setting operation is performed already in response to the rising of address transition detection signal ATD, so that the setting operation and the resetting operation of set/reset flip flop 128 for generating internal normal row activating signal /intRE never conflict with each other. Therefore, it is unnecessary to generate mask signal MASK by using reset control signal /RST0 as a trigger. By ensuring address transition detection signal ATD for the restore period or longer, an address signal, changing in a shorter cycle than the restore period, can be ignored, and a data access can be performed according to the address signal normally supplied without influence by an address noise skew.

Even if mask signal MASK falls to the L level during the data access operation period, the resetting operation is executed on completion of the data access, so that an accurate data access is insured.

The pulse width of mask signal MASK may be set to be substantially equal to the restore period.

Also in the configuration shown in FIG. 20, as shown in the configuration of FIG. 7, an output signal of the composite AND gate receiving refresh activating signal /REFE and internal normal row activating signal /intRE may be supplied to input node INB of shifter 125 for generating set control signal /SET0. In this case of the configuration, even when address transition detection signal ATD is generated in a state where a memory cell is in a selected state internally, after the internal state reliably recovers to the initial state, an access to the next address can be started. In the case of the configuration, therefore, for example, in the signal waveforms shown in FIG. 21, even when address transition detection signal ATD falls when reset signal /RST is activated, the setting operation and the resetting operation of flip flop 128 can be reliably prevented from being performed in an overlapping manner. The restore period will now be described.

Figure 22:
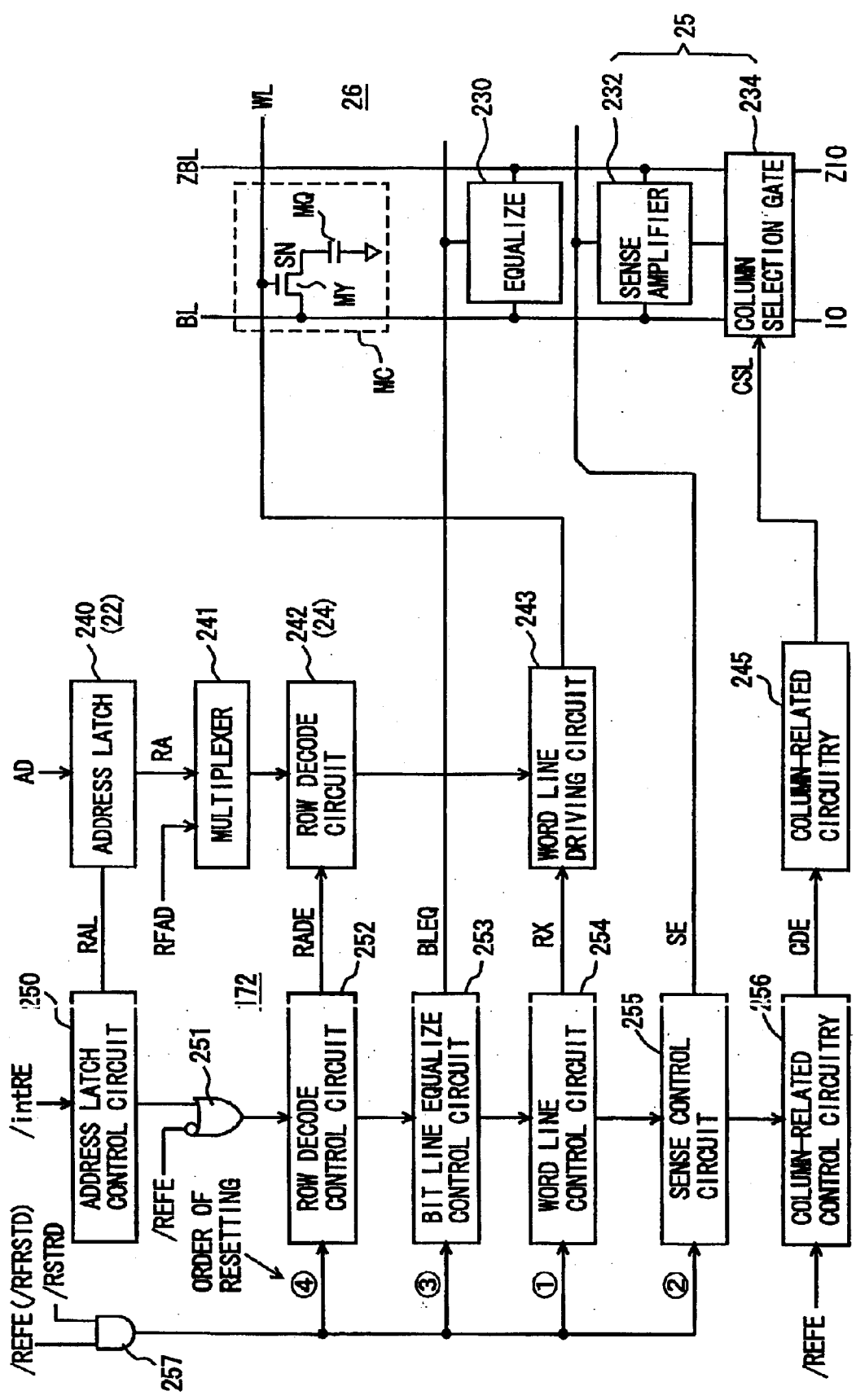
FIG. 22 is a diagram more specifically showing the configuration of a main part of the semiconductor memory device according to the third embodiment of the present invention.

FIG. 22 is a diagram schematically showing the configuration of a main part of the semiconductor memory device according to the present invention. FIG. 22 schematically shows the configuration of memory cell array 26, sense amplifier and input/output control circuit 25 shown in FIG. 1, row-related circuitry for performing operations related to row selection, and row-related control circuit for controlling the operation of the row-related circuitry.

In FIG. 22, memory cells MC are arranged in rows and columns in memory cell array 26. Word lines WL are disposed in correspondence with rows of memory cells MC and bit lines BL and ZBL are disposed in correspondence with columns of memory cells MC. In FIG. 22, one memory cell MC is representatively shown.

Memory cell MC includes a memory cell capacitor MQ for storing information in the form of charges, and an access transistor MT for connecting a storage node SN of memory cell capacitor MQ to corresponding bit line BL or ZBL in accordance with a signal on corresponding word line WL.

Bit lines BL and ZBL are arranged in pair. The pair of bit lines BL and ZBL are provided with a bit line equalize circuit 230 for precharging and equalizing bit lines BL and ZBL to a predetermined voltage VBL when activated, a sense amplifier 232 for differentially amplifying and latching potentials of bit lines BL and ZBL when activated, and a column selection gate 234 rendered conductive in accordance with a column selection signal CSL and connecting bit lines BL and ZBL to internal data lines IO and ZIO when made conductive. Sense amplifier 232 and column selection gate 234 correspond to components of the block of sense amplifier and input/output control circuit 25 shown in FIG. 1.

The row-related circuitry includes: an address latch 240 for taking in and latching a supplied address signal AD and generating an internal word line address signal RA; a multiplexer 241 for selecting one of a refresh address signal RFAD from refresh control circuit 40 and internal row address signal RA from address latch 240; a row decode circuit 242 for decoding a row address signal supplied via multiplexer 241 when a row address decode enable signal RADE is activated; and a word line drive circuit 243 for driving an addressed word line to a selected state in accordance with an output signal of row decode circuit 142 in response to activation of a word line driving timing signal RX.

Address latch 240 may be provided at the subsequent stage of the transfer latch circuit shown in FIG. 12 in the first embodiment. The transfer latch circuit in the first embodiment may be used in place of address latch 240.

The row-related circuitry includes bit line equalize circuit 230 and sense amplifier 242 and are controlled by the row-related control circuitry (corresponding to row-related control circuit 172 shown in FIG. 4).

The row-related control circuitry includes: an address latch control circuit 250 for activating an address latch instruction signal RAL in response to internal normal row activating signal /intRE; a gate circuit 251 for generating an activating signal in response to either an output signal of address latch control circuit 250 or refresh activating signal /REFE; a row decode control circuit 252 for activating a row address decode enable signal RADE in response to activation of an output signal of gate circuit 251; a bit line equalize control circuit 253 for inactivating a bit line equalize instruction signal BLEQ in response to activation of row address decode enable signal RADE from row decode control circuit 252; a word line control circuit 254 for activating word line driving timing signal RX in response to inactivation of bit line equalize instruction signal BLEQ from bit line equalize control circuit 253; and a sense control circuit 255 for activating a sense amplifier activating signal SE after elapse of a predetermined period in response to activation of word line driving timing signal RX.

Bit line equalize instruction signal BLEQ from bit line equalize control circuit 253 is supplied to bit line equalize circuit 230, and sense amplifier activating signal SE from sense control circuit 255 is supplied to sense amplifier 232. When sense amplifier activating signal SE from sense control circuit 255 is activated, first, as shown in FIG. 10, a column activating signal CDE from a column-related control circuitry 256 is activated in accordance with activation of a restore period signal /RSTR and a column-related circuitry 245 operates.

Column-related control circuitry 256 may include leading edge pulse generating circuit1 134 shown in FIG. 20 or generate a column activating signal or a column control signal in accordance with column activating signal /CDE and an output signal of sense control circuit 255. Therefore, in FIG. 22, control signal CDE of a positive logic is shown as a column activating signal.

Column-related circuitry 245 includes a column decoder, an internal data line equalize circuit, an internal write circuit, and an internal read circuit. In FIG. 22, the configuration of generating column selection signal CSL from column-related circuitry 245 is representatively shown.

Column-system circuit 245 includes, as an internal write circuit and an internal read circuit, a write driver for generating internal write data and writing it to a selected memory cell and a preamplifier for amplifying read data from the selected memory cell. Column selection gate 234 may be included in column-related circuitry 245.

When refresh activating signal /REFE is activated, column-related control circuitry 256 is maintained in a reset state, and a column selecting operation is inhibited.

As a reset circuit for initializing the row-related control circuitry, a gate circuit 257 receiving delayed restore period signal /RSTRD and refresh activating signal /REFE is provided. According to an output signal of gate circuit 257, control circuits from row decode control circuit 252 to sense control circuit 255 are reset in a predetermined sequence in accordance with the output signal of gate circuit 257.

As the reset sequence, first, word line driving timing signal RX is inactivated and, subsequently, sense amplifier activating signal SE is made inactive. Subsequently, bit line equalize instruction signal BLEQ is activated, equalizing and precharging of a bit line is executed, and the row decoding operation is stopped. In response to inactivation of the row decoding operation, internal normal row activating signal /intRE is inactivated. Internal normal row activating signal /intRE is a signal indicative of the internal state and is inactivated when the internal state recovers to the initial state.

Refresh activating signal /REFE indicates that the internal state is in a refreshing state. Therefore, as shown in parentheses in FIG. 22, by using a refresh restore period signal /RFRSTD for internally completing the refreshing operation after elapse of a predetermined period since activation of refresh activating signal /REFE, resetting of the row-related control circuitry is executed. In response to inactivation of refresh restore period signal /RFRSTD, refresh activating signal /REFE is made inactive, it indicates release from the refreshing state, and the next data access is permitted.

Refresh store period signal /RFRSTD is merely required to change faster in timing than restore activating signal /REFE. An output signal of the preceding stage of buffer 48 shown in FIG. 2, that is, the output of flip flop 45 may be used as refresh restore period signal /RFRSTD.

Figure 23:
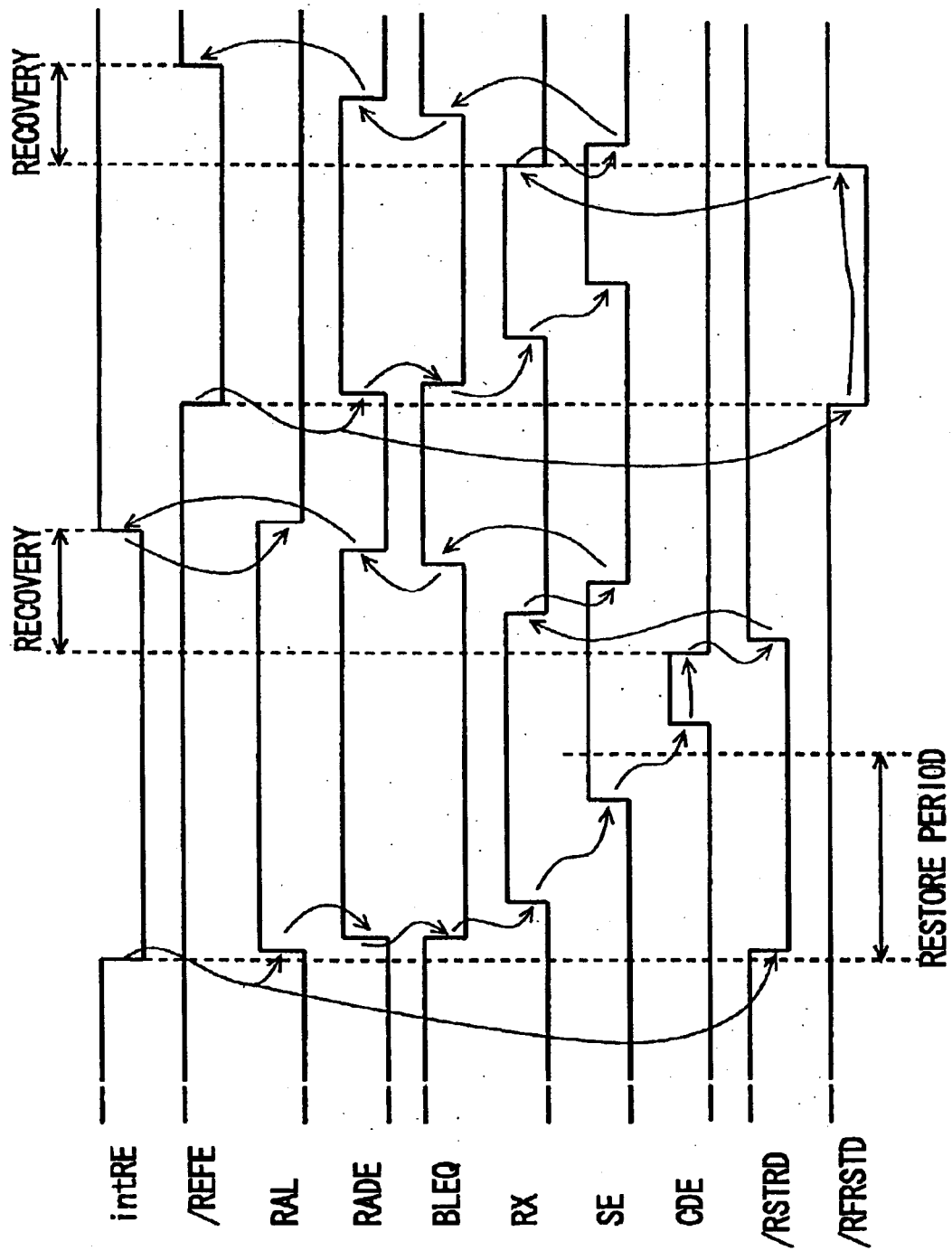
FIG. 23 is a signal waveform diagram representing an operation of a circuit shown in FIG. 22.

FIG. 23 is a timing chart representing an operation of the circuits shown in FIG. 22. Referring to FIG. 23, the operation of the configuration shown in FIG. 22 will be described in the following. In a normal data accessing operation, internal normal row activating signal /intRE is activated in accordance with a data access instruction and, accordingly, delayed restore period signal /RSTRD is activated. In response to activation of internal normal row activating signal /intRE, row address latch instruction signal RAL from address latch control circuit 250 is activated, and address latch 240 latches the supplied signal and generates row address signal RA.

Subsequently, in response to activation of an output signal of gate circuit 251, row address decode enable signal RADE outputted from row decode control circuit 252 is activated and then, bit line equalize instruction signal BLEQ is made inactive. Row decode circuit 242 starts the decoding operation, the operation of equalizing bit lines BL and ZBL is stopped, and bit lines BL and ZBL enter a floating state at precharge voltage VBL.

Word line driving timing signal RX from word line control circuit 254 is then activated. By word line drive circuit 253, according to a word line selection signal outputted from row decode circuit 242, a word line WL arranged corresponding to an addressed row is driven to a selected state.

Subsequently, sense control circuit 255 activates sense amplifier activating signal SE at a predetermined timing, and sense amplifier 232 senses, amplifies, and latches data read on bit lines BL and ZBL. The period, in which the row selecting operation is started, sense amplifier activating signal SE is activated, potentials of bit lines BL and ZBL are made definite, and the data is written into original memory cell MC, is the restore period. The period is ensured by restore period signal /RSTR.

When sense amplifier activating signal SE is activated and a so-called column interlock period elapses, column activating signal CDE is activated, the column-related circuitry operates, a column selecting operation is performed, and data access is performed. Column activating signal CDE is, as shown in FIG. 7, a signal corresponding to a one-shot pulse signal generated from leading edge pulse generating circuit 134. After elapse of predetermined time, the column selecting operation is terminated. Column activating signal CDE is made inactive, followed by recovery operation to the initial state of the column-related circuitry, and thus, the column recovery period is started.

When column activating signal /CDE or CDE is made inactive, column recovery period signal COLRWACT is made inactive after elapse of the column recovery period, and delayed restore period signal /RSTRD is made inactive.

In the sequence of initializing the row-related control signals, first, word line control circuit 254 is reset, and word line driving timing signal RX is made inactive. Subsequently, sense control circuit 255 is made inactive, sense amplifier activating signal SE is made inactive, and sense amplifier 232 is made inactive.

Subsequently, bit line equalize instruction signal BLEQ is activated to equalize the potentials of the power supply voltage level and the ground voltage level of bit lines BL and ZBL. When equalization of the bit line potentials is started, row decode control circuit 212 is reset, and row address decode enable signal RADE is made inactive. Then, internal normal row activating signal /intRE is made inactive. Responsively, address latch 240 has the latching operation terminated, and is set to a state of accepting the next address.

The period, starting at inactivation of column activating signal /CDE, until driving to inactive state of internal normal row activating signal /intRE is the recovery period, and an erroneous operation during the recovery period is prevented by delayed restore period signal /RSTRD.

In the refreshing operation, refresh activating signal /REFE is activated, and row address decode enable signal RADE from row decode control circuit 252 is activated. In the refreshing operation, multiplexer 241 selects refresh address RFAD and supplies it to row decode circuit 242. Subsequently, in a manner similar to a normal data access, word line control circuit 254 and sense control circuit 255 are sequentially activated, a word line corresponding to the refresh address is driven to a selected state by word line drive circuit 243, and operations of sensing, amplifying, and rewriting data of memory cells connected to a refresh row is performed by sense amplifier 232.

In the refreshing operation, refresh restore period signal /RFRSTD is generated, after elapse of a predetermined time, word line driving timing signal RX is made inactive, and then sense amplifier activating signal SE is made inactive. Subsequently, bit line equalize instruction signal BLEQ is activated to equalize bit lines to a predetermined voltage level, and subsequently row decode control circuit 252 is made inactive. Then, refresh activating signal /REFE is made inactive.

Therefore, in the refreshing operation, when the so-called restore period in the refreshing is completed, a word line is driven to a non-selected state. The period since refresh restore period signal /RFRSTD rises to the H level until refresh activating signal /REFE is made inactive is the recovery period in refreshing.

For inactivating internal normal row activating signal /intRE or refresh activating signal /REFE after row address decode enable signal RADE is inactivated, the signals may be inactivated by directly utilizing the signal response relationship of these signals or by simply adjusting delay time of delay circuitry. For example, as for refresh activating signal /REFE, in the configuration shown in FIG. 2, if a configuration of using output signal φA2 of delay circuit 49 as refresh restore period signal /RFRSTD and resetting set/reset flip flop 45 in response to the falling of row address decode enable signal RADE is used, the signal waveforms at the time of refreshing shown in FIG. 23 can be readily secured.

Internal normal row activating signal /intRE and refresh activating signal /REFE indicate the internal states. When the internal state is reset, the internal circuitry has substantially recovered to the initial state, so that activation/inactivation of internal operation control signals for the next operation cycle is executed. With such configuration, the so-called RAS precharge period in a DRAM is reliably ensured. After completion of refreshing, the next data access can be promptly started. In this case, the time period from inactivation of delayed restore period signal /RSTRD to inactivation of internal normal row activating signal /intRE is only required to correspond to a time width defined by the so-called RAS precharge time.

In the configuration shown in FIG. 20, refresh activating signal /REFE may be configured to be supplied to leading edge pulse generating circuit 132 for maintaining, in a refresh operation, column activating signal /CDE in an inactive state.

Figure 24:
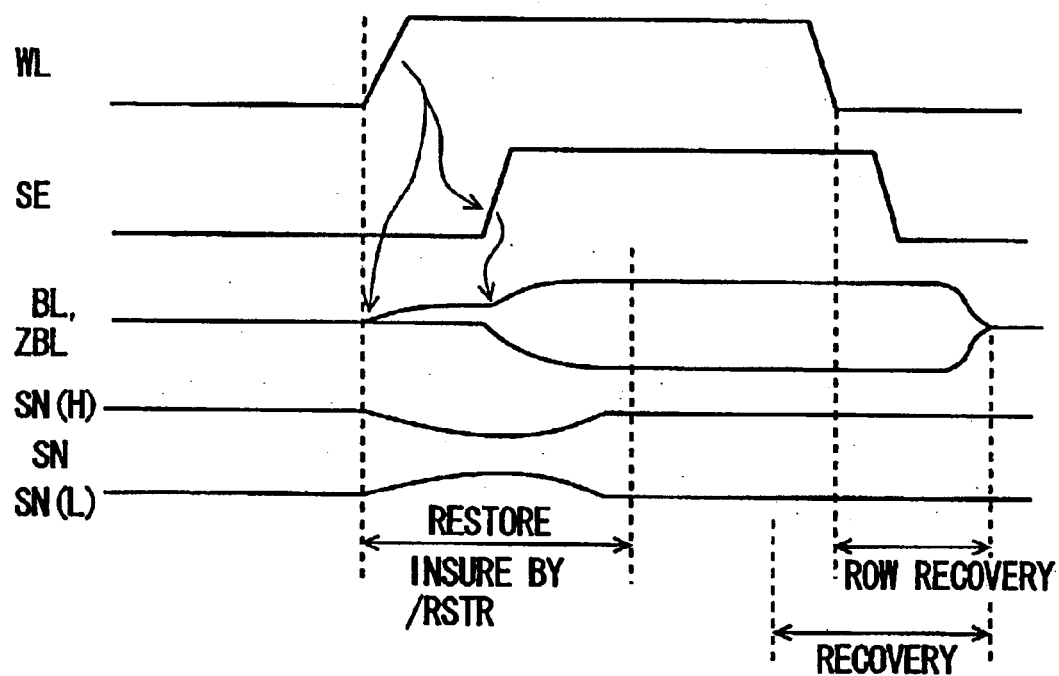
FIG. 24 is a signal waveform diagram representing an operation in selecting a memory cell in the configuration shown in FIG. 22.

FIG. 24 is a diagram schematically illustrating a potential change in storage node SN of the memory cell shown in FIG. 23. FIG. 24 shows both a potential SN <H> in the case of storing H-level data at storage node SN and a potential SN <L> in the case of storing L-level data thereat.

When word line WL is selected, charges according to data stored in selected memory cell MC are transmitted from memory cell capacitor MQ to bit line BL or ZBL. FIG. 24 shows a signal waveform of a bit line in the case of reading H-level data. When word line WL is selected and access transistor MT is made conductive, storage node SN and bit line BL (or ZBL) are connected to each other. Bit lines BL and ZBL are equalized to, for example, an intermediate voltage level, charges move between bit line BL (or ZBL) and storage node SN, and the potential of storage node SN changes.

Subsequently, sense amplifier 232 is made active and bit lines BL and ZBL are driven to the power supply voltage and the ground voltage level, the charges on bit line BL or ZBL are transmitted to storage node SN of the memory cell via the access transistor, and the potential of storage node SN restores to original potential SN <H> or SN <L>. The period required to restore the potential of storage node SN in memory cell MC to the original potential level is the restore period, which is ensured by restore period signal /RSTR.

On the other hand, when word line WL is driven to a non-selected state, sense amplifier activating signal SE is inactivated. Subsequently, bit line equalize instruction signal BLEQ is activated, and bit lines BL and ZBL are equalized to a predetermined precharge voltage level. In a data access, a column selecting operation is terminated before word line WL is made inactive. Therefore, actual column recovery time starts before the word line is made inactive. The period required to reset the row-related circuitry, that is, the row recovery period starts with inactivation of word line WL being a starting point. The recovery period of the semiconductor memory device is ensured by the signals COLRWACT and /RSTRD.

Therefore, even if a data access completion instruction (or refresh completion instruction) is supplied during a restoring operation or recovering operation being a transient state, reliably, after completion of the restore period or recovery period, the next data access can be performed. Thus, the restoring operation or column recovery operation is not interrupted and occurrence of data destruction can be prevented.

As described above, according to the third embodiment of the present invention, transfer of address transition detection signal ATD to the leading edge pulse generating circuit for generating a pulse signal for resetting the internal normal row activating signal is masked when the internal normal row activating signal is set, so that the internal operation start timing can be advanced. In addition, it is unnecessary to mask address transition detection signal ATD at the time of resetting, so that the internal reset signal generating timing can be advanced.

Fourth Embodiment

Figure 25:
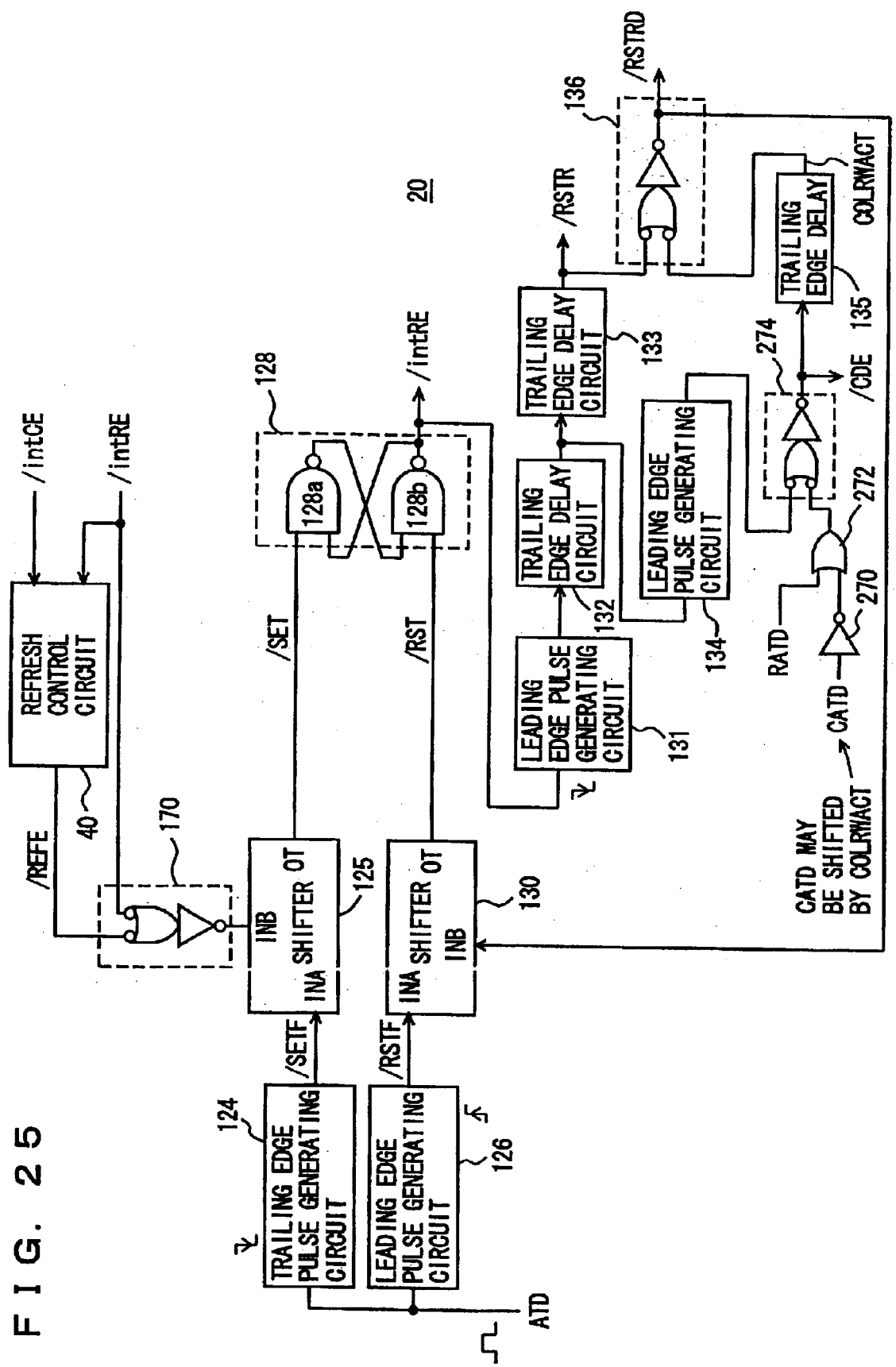
FIG. 25 is a diagram schematically showing the configuration of a main control circuit according to a fourth embodiment of the present invention.

FIG. 25 is a diagram schematically showing the configuration of main control circuit 20 according to a fourth embodiment of the present invention. The configuration of FIG. 25 is different from that of the main control circuit shown in FIG. 7 in the following points. Specifically, a row address transition detection signal RATD, activated when a transition in a row address signal is detected, is supplied to trailing edge pulse generating circuit 124 and to leading edge pulse generating circuit 126. An output signal of shifter 125 is directly supplied to set/reset flip flop 128.

Between leading edge pulse generating circuit 134 for generating a column activating signal and trailing edge delay circuit 135 for generating column restore period signal COLRWACT, a composite AND gate 274 is provided. A column activating signal /CDE is outputted from composite AND gate 274. To composite AND gate 274, an inverter 270 receiving a column address transition detection signal CATD and an OR circuit 272 receiving an output signal of inverter 270 and a row address transition detection signal RATD are provided. To composite AND gate 274, an output signal of OR gate 272 and an output signal of leading edge pulse generating circuit 134 are supplied.

The other configuration of main control circuit 20 shown in FIG. 25 is the same as that of the main control circuit shown in FIG. 7, corresponding parts are designated by the same reference numerals, and the detailed description thereof will not be repeated.

In the configuration of main control circuit 20 shown in FIG. 25, row address transition detection signal RATD generated from a row address signal is used to control a row related operation in a normal operation mode. On the other hand, column address transition detection signal CATD generated from the column address signal is used only for controlling a column related operation. Consequently, when switching the column address in the order of CA1, CA2, and CA3 while fixing a row address, a page mode operation of performing an access by sequentially selecting columns under a state where the same row is selected can be implemented.

Since the refresh control is related only to operations of row related circuitry, in the case where a row address signal transitions, the timing of starting an access to a row shifts depending on to the presence/absence of refresh. A page operation of successively accessing different columns in column-related circuits, however, does not conflict with the refreshing. Therefore, a page access is not influenced by the refreshing and high speed access can be achieved.

Figure 26:
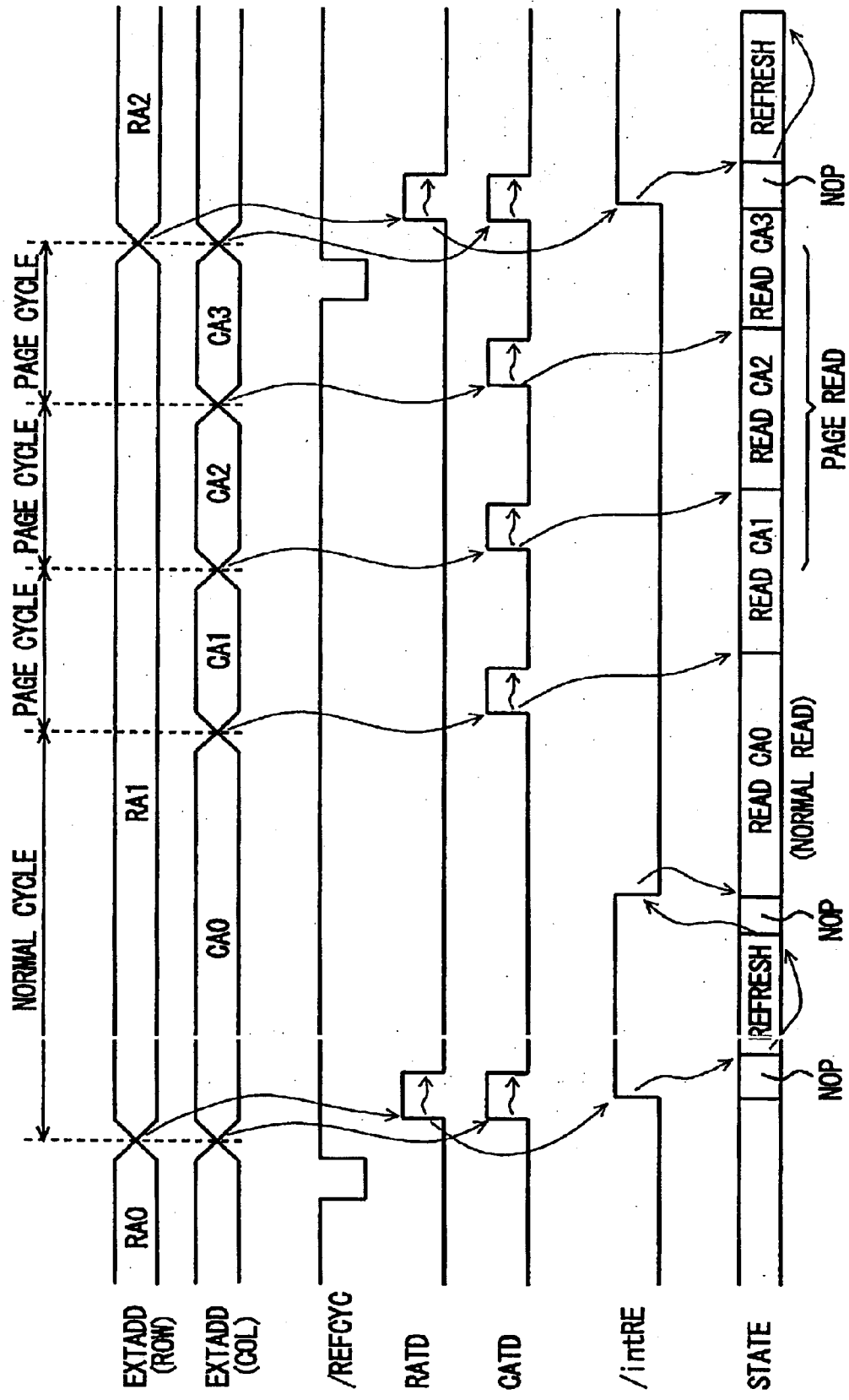
FIG. 26 is a signal waveform diagram representing an operation of a main control circuit shown FIG. 25.

FIG. 26 is a timing chart representing an operation of the main control circuit shown in FIG. 25. Referring to FIG. 26, the operations of the main control circuit shown in FIG. 25 will now be briefly described.

A state is considered where refresh cycle signal /REFCYC is made active at the time of an access to row address RA0. When a row address transitions from address RA0 to address RA1, row address transition detection signal RATD and column address transition detection signal CATD are activated. In response to the rising of row address transition detection signal RATD, reset signal /RST is activated by leading edge pulse generating circuit 126 and shifter 130, and internal normal row activating signal /intRE from set/reset flip flop 128 is made inactive.

In response to inactivation of internal normal row activating signal /intRE, refresh control circuit 40 activates refresh activating signal /REFE. Therefore, at this time, even if set fast signal /SEDF from trailing edge pulse generating circuit 124 is activated in response to the falling of row address transition detection signal RATD, activation of set signal /SET outputted from shifter 125 is delayed until the refreshing operation is completed.

When the refreshing operation is completed and refresh activating signal /REFE is made inactive, set signal /SET from shifter 125 is activated, set/reset flip flop 128 is set, internal normal row activating signal /intRE is activated, and the operations of selecting a word line corresponding to row address RA1 and selecting a column for column address CA0 are executed.

When row address transition detection signal RATD is active, an output signal of OR circuit 272 is at the H level, and column address transition detection signal CATD is neglected in the normal cycle. Therefore, a normal operation of row selection is carried out and a column interlock period is terminated. Subsequently, according to the pulse signal outputted from leading edge pulse generating circuit 134, column activating signal /CDE is activated (after elapse of the column interlock period, column address transition detection signal CATD is at the L level, an output signal of inverter 270 is at the H level, and an output signal of OR circuit 272 is at the H level). Therefore, in the normal cycle, by using the falling of row address transition detection signal RATD as a trigger, row and column selection operations are executed.

Subsequently, under a state where row address RA1 is maintained, the column address (COL) is transitioned in the order of CA1, CA2, and CA3. According to a transition in each column address signal, column address transition detection signal CATD is activated and, accordingly, column activating signal /CDE from composite AND gate 274 is activated for a predetermined period. In response to activation of column activating signal /CDE, the column selecting operation is performed in accordance with column address signals CA1, CA2, and CA3, and a data access is performed. Therefore, with respect to column addresses CA1 to CA3, a data access (data reading) can be performed in the page mode at high speed.

When a row address signal changes from row address RA1 to row address RA2, row address transition detection signal RATD is activated. At this time, column address signal COL also changes, and column address transition detection signal CATD is also activated in the timing chart of FIG. 26. However, column address signal COL may not change.

According to the activation of row address transition detection signal RATD, internal normal row activating signal /intRE is inactivated. During an access to column address CA3, refresh cycle signal /REFCYC is activated. In response to inactivation of internal normal row activating signal /intRE, refresh activating signal /REFE from refresh control circuit 40 is activated, and the refreshing operation is executed.

The refresh cycle exerts an influence only on the access time of the normal cycle, but does not exert any influence on the page access mode. Consequently, a data access can be performed at high speed. Particularly, the address transition detection signal is used, and a refresh-control-free DRAM capable of operating in a page mode and compatible with an address transition detection type SRAM interface can be implemented.

In the configuration shown in FIG. 25, if column address transition detection signal CATD is configured to recover to an inactive state during a column interlock period, the operation of the column-related circuitry is inhibited. Consequently, if there is not particularly caused a problem even when column activating signal /CDE is activated in such period, column address transition detection signal CATD may be directly supplied to composite AND gate 274.

Column address transition detection signal CATD may be configured to be shifted through a shifter, performing a shifting operation when a column-related restore period signal COLRWACT is active, to generate column activating signal /CDE. As such shifter, a shifter having the configuration similar to that of shifter 125 or 130 is used. Column restore period signal COLWACT is supplied to input node INB, and column address transition detection signal CATD is supplied to input node INA. After the column selecting operation recovers to the initial state, reliably, the next column selecting operation is executed.

The pulse width of column address transition detection signal CATD is set to be substantially the same as the pulse width of a pulse signal generated by leading edge pulse generating circuit 134.

Figure 27:
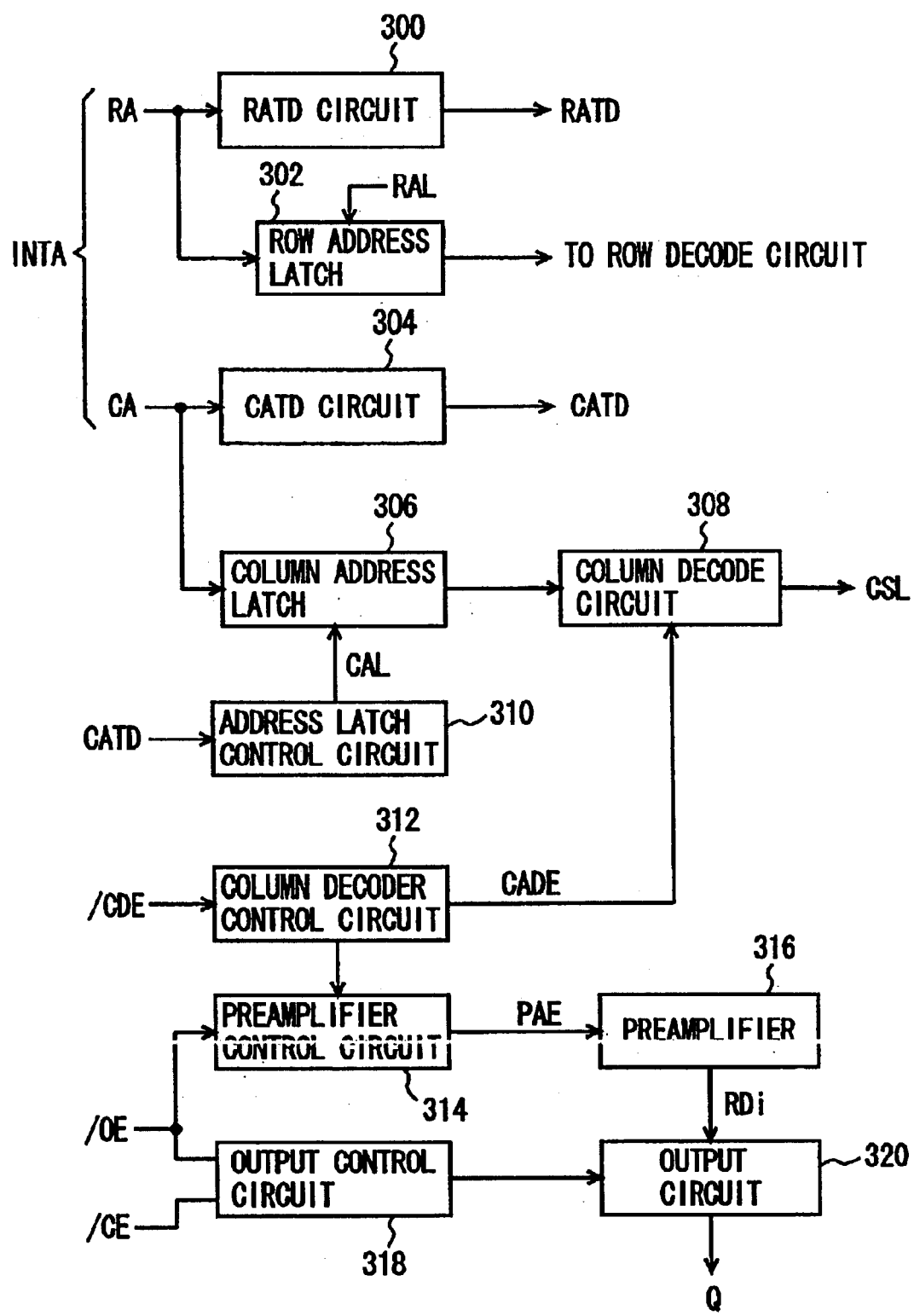
FIG. 27 is a diagram schematically showing the configuration of a main part of a semiconductor memory device according to the fourth embodiment of the present invention.

FIG. 27 is a diagram schematically showing the configuration of a main portion of main control circuit 20 in the fourth embodiment of the present invention. FIG. 27 shows the configuration of a part corresponding to row-related control circuit 172 and column-related control circuit 174 shown in FIG. 14.

In FIG. 27, the row-related control circuit includes an RATD circuit 300 for generating a one-shot pulse signal as row address transition detection signal RATD in response to a transition in internal row address signal RA. According to row address transition detection signal RATD, internal normal row activating signal /intRE is activated. According to internal normal row activating signal /intRE, the row-related control circuit shown in FIG. 22 operates. As the row-related circuits, a row address latch 302 for latching row address signal RA in accordance with address latch instruction signal RAL is representatively shown. Row address latch 302 corresponds to address latch 240 shown in FIG. 22. An internal row address signal outputted from row address latch 302 is supplied to row decode circuit 242 via the multiplexer shown in FIG. 22.

The column-related control circuitry include: a CATD circuit 304 for generating a one-shot pulse as column address transition detection signal CATD in response to a transition in internal column address signal CA; and an address latch control circuit 310 for generating column address latch instruction signal CAL in response to column address transition detection signal CATD. According to column address latch instruction signal CAL from address latch control circuit 310, column address latch 306 latches internal column address signal CA. A column address signal latched by column address latch 306 is supplied to a column decode circuit 308. Column decode circuit 308 is included in column-related circuitry 245 shown in FIG. 22.

The column-related control circuitry further include: a column decoder control circuit 312 for generating a column decode enable signal CADE in accordance with refresh activating signal /REFE and column activating signal /CDE; a preamplifier control circuit 314 for generating a preamplifier enable signal PAE at a predetermined timing in accordance with an output signal of column decoder control circuit 312 and output enable signal /OE; and an output control circuit 318 for generating an output control signal in accordance with output enable signal /OE and internal chip enable signal /CE.

Column decode circuit 308 performs a decoding operation in accordance with column decode enable signal CADE from column decoder control circuit 312, and activates column selection signal CSL for selecting an addressed column in accordance with a column address signal from column address latch 306.

A data reading part includes preamplifier 316 for performing operation of amplifying received memory cell data in response to activation of preamplifier enable signal PAE, and an output circuit 320 for buffering internal read data RDi from preamplifier 316 and generating external read data Q in accordance with the output control signal from output control circuit 318.

When column decode enable signal CAD is activated, preamplifier control circuit 314 activates preamplifier enable signal PAE at a predetermined timing.

When both of internal output enable signal /OE (/intOE) and internal chip enable signal /CE (/intCE) are active, output control circuit 318 activates the output control signal at a predetermined timing.

A memory cell is selected by column selection signal CSL from column decode circuit 308. When data of the selected memory cell is transmitted to preamplifier 316, preamplifier 316 is activated. After activation of preamplifier 316, output circuit 320 is activated.

In FIG. 27, a data write path is not shown. However, as to the data write path, an input control circuit for generating an input control signal in accordance with chip enable signal /CE and write enable signal /WE, and a write control circuit for generating a write driver enable signal in accordance with an output signal of column decode control circuit 312 and internal write enable signal /intWE are provided as write control circuitry.

The input circuit receives data supplied according to the input control signal, generates internal write data, and a write driver drives an internal data line and transmits write data to a selected memory cell when made active in response to the write driver enable signal.

As shown in FIG. 27, by controlling the operation of latching the column address signal in accordance with column address transition detection signal CATD, when the column address signal changes in a page mode operation, a supplied column address signal is latched by column address latch 306, and the column selecting operation can be internally performed sequentially.

To address latch control circuit 310, a signal obtained by taking an OR of row address transition detection signal RATD and column address transition detection signal CATD may be applied as an activation timing signal. In the case of accessing the same column in different pages (word lines) at the time of switching a page, a column address signal can be latched with accuracy.

In the configuration shown in FIG. 25, an output signal of composite AND gate 170 is supplied to input node INB of shifter 125 for generating a set signal /SET. However, refresh activating signal /REFE outputted from refresh control circuit 40 may be supplied to input node INB of shifter 125.

As described above, according to the fourth embodiment of the present invention, the address transition detection signal is generated for each of the row address signal and the column address signal, the internal normal row activating signal is generated according to the row address transition detection signal, and column activating signal /CDE is generated according to the column address transition detection signal. Thus, a DRAM capable of operating in a page mode and having an interface compatible with an SRAM interface can be implemented.

For the configuration of the main control circuit shown in the fourth embodiment, a combination of any of the configurations of the first to third embodiments may be used.

Fifth Embodiment

Figure 28:
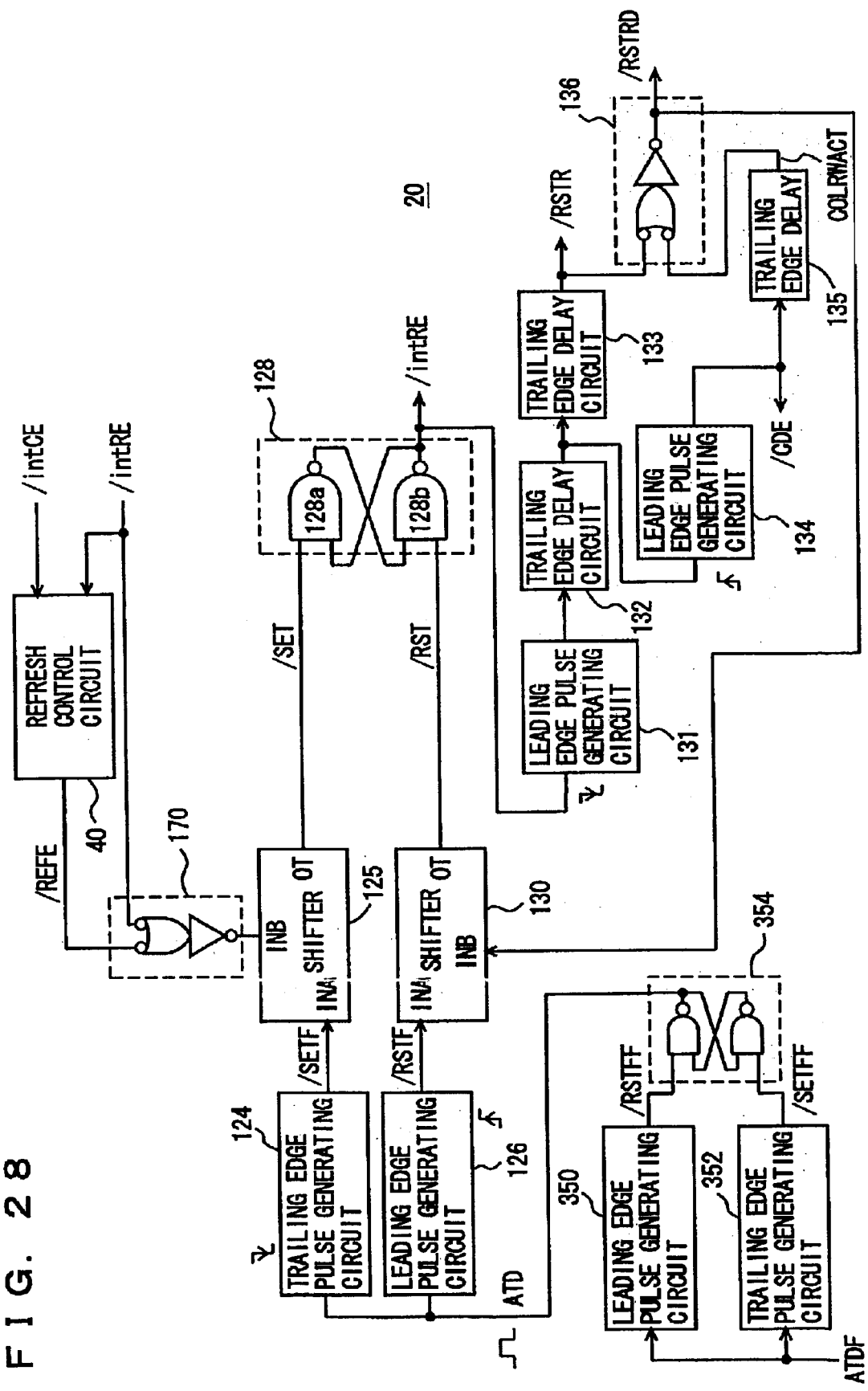
FIG. 28 is a diagram schematically showing the configuration of a main control circuit according to a fifth embodiment of the present invention.

FIG. 28 is a diagram schematically showing the configuration of main control circuit 20 according to a fifth embodiment of the present invention. In the configuration of main control circuit 20 shown in FIG. 28, no delay circuit is provided between shifter 125 receiving set fast signal /SETF and set/reset flip flop 128 for generating internal normal row activating signal /intRE. To trailing edge pulse generating circuit 124 for generating set fast signal /SETF and leading edge pulse generating circuit 126 for generating reset fast signal /RSTF, address transition detection signal ATD from a set/reset flip flop 354 is supplied.

To set-reset flip flop 354, there is provided a leading edge pulse generating circuit 350 and a trailing edge pulse generating circuit 352 each receiving an address transition detection fast signal ATDF. Leading edge pulse generating circuit 350 generates one-shot pulse signal /RSTFF, in response to the leading edge of address transition detection fast signal ATDF, to reset set/reset flip flop 354. Trailing edge pulse generating circuit 352 generates a one-shot pulse signal /SETFF, in response to the trailing edge of address transition detection fast signal ATDF, to set the set/reset flip flop 354.

When set/reset flip flop 354 is reset, address transition detection signal ATD rises to the H level. When set/reset flip flop 354 is set, address transition detection signal ATD falls to the L level.

The other configuration of main control circuit 20 shown in FIG. 28 is the same as that of the main control circuit shown in FIG. 7. Corresponding parts are designated by the same reference numerals and the detailed description thereof will not be repeated.

FIG. 29 is a signal waveform chart representing an operation of a part for generating address transition detection signal ATD of the main control circuit shown in FIG. 28. Referring to FIG. 29, an operation of generating address transition detection signal ATD will now be briefly described.

When address transition detection fast signal ATDF rises to the H level, leading edge pulse generating circuit 350 causes pulse signal /RSTFF to fall to the L level for resetting set/reset flip flop 354. Accordingly, address transition detection signal ATD rises to the H level.

When address transition detection fast signal ATDF falls to the L level, pulse signal /SETFF outputted from trailing edge pulse generating circuit 352 turns L level. At this time, pulse signal /RSTFF falls to the L level, and address transition detection signal ATD maintains the H level. When pulse signal /RSTFF attains to the H level and pulse signal /SETFF attains to the L level, set/reset flip flop 354 is brought into a set state and address transition detection signal ATD attains to the L level.

Therefore, even when the pulse width of address transition detection fast signal ATDF is substantially on the order of a width of noise, address transition detection signal ATD having an adequate width can be generated by set/reset flip flop 354. Thus, set signal /SET and reset signal /RST for controlling set/reset of internal normal row activating signal /intRE can be accurately generated.

In the configuration shown in FIG. 28, as shown in FIG. 29, the pulse width of address transition detection signal ATD differs for different pulse widths of address transition detection fast signal ATDF. However, by setting each of pulse signals /RSTFF and /SETFF generated by leading edge pulse generating circuit 350 and trailing edge pulse generating circuit 352 to a sufficient pulse width, the pulse width of address transition detection signal ATD from set/reset flip flop 354 ca be set to, at the minimum, the pulse width of pulse signal /RSTFF.

Address detection fast signal ATDF is generated by an address transition detection circuit receiving internal address signal INTAD.

Modification

FIG. 30 is a diagram schematically showing the configuration of a modification of the fifth embodiment of the present invention. In the configuration shown in FIG. 30, at the subsequent stage of set/reset flip flop 254, there are further provided a leading edge pulse generating circuit 360 for generating a one-shot pulse signal in response to a leading edge of an output pulse ATDF1 of set/reset flip flop 354 and a trailing edge delay circuit 362 for delaying the trailing edge of an output pulse signal of leading edge pulse generating circuit 360. Address transition detection signal ATD is outputted from trailing edge delay circuit 362 and supplied to pulse generating circuits 124 and 126 shown in FIG. 28.

In the case of the configuration shown in FIG. 30, when set/reset flip flop 354 is reset and its output ATDF1 is activated, address transition detection signal ATD is made active. The active period of address transition detection signal ATD is determined by the pulse width of a pulse signal outputted from leading edge pulse generating circuit 360 and delay time of trailing edge delay circuit 362. Therefore, irrespective of the pulse width of address transition detection fast signal ATDF, address transition detection signal ATD having a predetermined pulse width can be generated.

By setting delay time of trailing edge delay circuit 362 to be, for example, equal to or longer than the restore period, even if an address signal changes and address transition detection fast signal ATDF is activated in a short cycle due to an address skew or the like, the address signal in the short cycle can be neglected by trailing edge delay circuit 360, and a data access can be performed only to an address signal supplied in a normal cycle having a time width of a period equal to or longer than a predetermined time.

Also in the fifth embodiment of the present invention, any of the foregoing first to fourth embodiments may be used in combination.

As described above, according to the fifth embodiment of the present invention, an output signal of the address transition detection circuit is received by the set/reset flip flop and the address transition detection signal is generated. Even if an output pulse width of the address transition detection circuit is very small, the address transition detection signal having a normal pulse width can be generated. The internal operation can thus be performed by using an address transition as a start point of the internal operation with accuracy without being influenced by noise.

As described above, according to the present invention, internal operation is performed using a transition in an address signal as a starting point thereof A refresh-control-free DRAM having an address transition detection type interface can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells;
   an operation mode instruction signal generating circuit for generating an operation mode instruction signal;
   a cell selection control signal generating circuit for generating a cell selection control signal in response to said operation mode instruction signal;
   a delay circuit for delaying said cell selection control signal;
   a cell selection activation control signal generating circuit for generating a cell selection activation control signal for controlling an operation of selecting a memory cell in the memory cells in response to an output signal of said delay circuit; and
   a mask circuit for prohibiting transfer of said operation mode instruction signal to said cell selection control signal generating circuit in response to said cell selection control signal.

2. The semiconductor memory device according to claim 1, wherein
   said operation mode instruction signal generating circuit comprises an address transition detection circuit for detecting a transition in an address signal supplied and generating said operation mode instruction signal, and
   said mask circuit inhibits transfer of said address signal to said address transition detection circuit in response to said cell selection control signal.

3. The semiconductor memory device according to claim 2, wherein
   said address transition detection circuit generates a one-shot pulse signal as said address transition detection signal in response to the transition in said address signal,
   said cell selection control signal generating circuit generates, as said cell selection control signal, a cell selection instruction signal for instructing activation of a memory cell selecting operation in response to a trailing edge of said address transition detection signal, and
   said cell selection activation control signal generation circuit generates, as said cell selection activation control signal, a cell selection activating signal for activating a cell selecting operation on the memory cells in response to the output signal of said delay circuit.

4. The semiconductor memory device according to claim 2, wherein
   said address transition detection circuit generates a one-shot pulse signal as said address transition detection signal in response to a transition in said address signal,
   said cell selection control signal generating circuit generates, as said cell selection control signal, a cell selection completion instruction signal for instructing completion of the memory cell selecting operation in response to a leading edge of said address transition detection signal, and
   said cell selection activation control signal generation circuit generates, as said cell selection activation control signal, a cell selection inactivating signal for inactivating a memory cell selecting operation in response to the output signal of said delay circuit.

5. The semiconductor memory device according to claim 2, wherein
   said address transition detection circuit generates, as said address transition detection signal, a one-shot pulse signal in response to the transition in said address signal,
   said cell selection control signal generating circuit includes:
      a cell selection instruction signal generating circuit for generating a cell selection instruction signal for instructing activation of an operation of selecting a memory cell in the memory cells in response to a trailing edge of said address transition detection signal; and
      a cell selection completion instruction signal generating circuit for generating a cell selection completion instruction signal for instructing completion of the operation of selecting the memory cell in response to a leading edge of said address transition detection signal,
   said delay circuit includes:
      a first delay circuit for delaying said cell selection instruction signal; and
      a second delay circuit for delaying said cell selection completion instruction signal,
   said cell selection activation control signal generation circuit activates a cell selection activating signal for activating the memory cell selecting operation in response to an output signal of said first delay circuit and inactivates said cell selection activating signal in accordance with an output signal of said second delay circuit, and
   said mask circuit inhibits transfer of said address signal to said address transition detection circuit in response to activation of either of said cell selection instruction signal and said cell selection completion instruction signal.

6. The semiconductor memory device according to claim 1, wherein
   said cell selection control signal generation circuit includes an arbitration circuit for delaying generation of said cell selection control signal until the selecting operation is completed when the memory cell selecting operation is performed.

7. The semiconductor memory device according to claim 1, wherein
   said operation mode instruction signal generating circuit comprises an address transition detection circuit for generating, as said operation mode instruction signal, an address transition detection signal of a one-shot pulse signal in response to a transition in a supplied address signal, and
   said mask circuit prohibits transfer of said address transition detection signal to said cell selection control signal generating circuit.

8. The semiconductor memory device according to claim 7, wherein
   said cell selection control signal generating circuit includes:
      a selection operation activation instruction signal generating circuit for generating a memory cell selecting operation activating instruction signal for instructing activation of a memory cell selecting operation in response to a trailing edge of said address transition detection signal; and
      a selection operation completion instruction signal generating circuit for generating a memory cell selecting operation completion instruction signal for instructing completion of the memory cell selecting operation in response to a leading edge of said address transition detection signal, and said mask circuit prohibits transfer of said address transition detection signal to said selection operation completion instruction signal generating circuit in response to said memory cell selection operation activating instruction signal.

9. The semiconductor memory device according to claim 8, wherein said plurality of memory cells are arranged in rows and columns, said semiconductor memory device further comprises a memory cell selecting circuit for executing a row selecting operation and a column selecting operation on the memory cells in a time division multiplexed manner in response to activation of said memory cell selecting operation activating instruction signal, and said address transition detection signal has an active state of a period of time required at least to restore storage data of a selected memory cell since a row selection on the memory cells.

* * * * *